(12) United States Patent
Pan et al.

(10) Patent No.: US 9,738,826 B2
(45) Date of Patent: Aug. 22, 2017

(54) MATERIALS FOR ORGANIC ELECTROLUMINESCENCE DEVICES

(75) Inventors: Junyou Pan, Frankfurt am Main (DE); Rémi Manouk Anémian, Seoul (KR); Susanne Heun, Bad Soden (DE); Thomas Eberle, Landau (DE); Niels Schulte, Kelkheim (DE)

(73) Assignee: Merck Patent GmbH, Darmstadt (DE)

( * ) Notice: Subject to any disclaimer, the term of this patent is extended or adjusted under 35 U.S.C. 154(b) by 740 days.

(21) Appl. No.: 13/976,666

(22) PCT Filed: Dec. 2, 2011

(86) PCT No.: PCT/EP2011/006046
§ 371 (c)(1),
(2), (4) Date: Jun. 27, 2013

(87) PCT Pub. No.: WO2012/089294
PCT Pub. Date: Jul. 5, 2012

(65) Prior Publication Data
US 2013/0299743 A1    Nov. 14, 2013

(30) Foreign Application Priority Data
Dec. 28, 2010   (DE) ................ 10 2010 056 151

(51) Int. Cl.
| H01L 51/54 | (2006.01) |
|---|---|
| C09K 11/06 | (2006.01) |
| C08G 61/12 | (2006.01) |
| H01L 51/00 | (2006.01) |
| H01L 51/50 | (2006.01) |

(52) U.S. Cl.
CPC .......... *C09K 11/06* (2013.01); *C08G 61/12* (2013.01); *C08G 61/122* (2013.01); *C08G 61/124* (2013.01); *H01L 51/0035* (2013.01); *H01L 51/0039* (2013.01); *H01L 51/0043* (2013.01); *C08G 2261/124* (2013.01); *C08G 2261/3142* (2013.01); *C08G 2261/3162* (2013.01); *C08G 2261/3221* (2013.01); *C08G 2261/3241* (2013.01); *C08G 2261/344* (2013.01); *C08G 2261/5242* (2013.01); *C08G 2261/95* (2013.01); *H01L 51/5016* (2013.01); *Y02E 10/549* (2013.01)

(58) Field of Classification Search
CPC ........ C08G 61/00; C08G 61/02; C08G 61/10; C08G 61/12; C08G 61/122; C08G 61/124; C08G 2261/00; C08G 2261/10; C08G 2261/12; C08G 2261/124; C08G 2261/30; C08G 2261/31; C08G 2261/314; C08G 2261/3142; C08G 2261/316; C08G 2261/3162; C08G 2261/32; C08G 2261/3221; C08G 2261/3241; C08G 2261/324; C08G 2261/3242; C08G 2261/3243; C08G 2261/3244; C08G 2261/3245; C08G 2261/3246; C08G 2261/3247; C08G 2261/344; C08G 2261/50; C08G 2261/52; C08G 2261/522; C08G 2261/5222; C08G 2261/524; C08G 2261/5242; C08G 2261/95; C09K 11/06; C09K 2211/14; C09K 2211/1408; C09K 2211/1416; C09K 2211/1441; C09K 2211/145; C09K 2211/1458; C09K 2211/1466; C09K 2211/1475; C09K 2211/1483; C09K 2211/1491; C09K 2211/18; C09K 2211/185; H01L 51/0032; H01L 51/0034; H01L 51/0035; H01L 51/0036; H01L 51/0039; H01L 51/0043; H01L 51/50; H01L 51/5012; H01L 51/5016; Y02E 10/549

USPC ............. 257/40, 88–104, E51.001–E51.052; 252/301.16–301.35; 528/228, 423; 428/690, 691, 411.4, 917, 336; 427/58, 427/66; 313/500–512

See application file for complete search history.

(56) References Cited

U.S. PATENT DOCUMENTS

| 7,173,140 | B2 | 2/2007 | Li et al. |
|---|---|---|---|
| 7,402,681 | B2 | 7/2008 | Ong et al. |
| 8,278,394 | B2 * | 10/2012 | Pan ................ C08G 61/02 525/242 |
| 8,344,095 | B2 | 1/2013 | Miura et al. |
| 9,200,156 | B2 * | 12/2015 | Pan ................ C08G 61/02 |
| 2006/0124921 | A1 | 6/2006 | Ong et al. |
| 2006/0128969 | A1 | 6/2006 | Li et al. |
| 2006/0214155 | A1 | 9/2006 | Ong et al. |
| 2007/0112167 | A1 | 5/2007 | Li et al. |
| 2007/0112172 | A1 * | 5/2007 | Li ............... C07D 487/04 528/377 |
| 2009/0026448 | A1 * | 1/2009 | Meyer .............. H01L 51/0003 257/40 |
| 2009/0184635 | A1 * | 7/2009 | Pan ................ C08G 61/02 313/504 |
| 2009/0309488 | A1 | 12/2009 | Kato et al. |
| 2011/0037027 | A1 | 2/2011 | Stoessel et al. |
| 2012/0061617 | A1 | 3/2012 | Heun et al. |

FOREIGN PATENT DOCUMENTS

| EP | 2301926 A1 | 3/2011 |
|---|---|---|
| JP | 2009-190999 A | 8/2009 |
| WO | WO-2009124627 A1 | 10/2009 |
| WO | WO-2009148015 A1 | 12/2009 |
| WO | WO-2010/136110 A2 | 12/2010 |

OTHER PUBLICATIONS

International Search Report for PCT/EP2011/006046 mailed Mar. 1, 2012.

\* cited by examiner

*Primary Examiner* — Andrew K Bohaty

(57) ABSTRACT

The present invention relates to copolymers containing indenocarbazole derivatives having electron- and hole-transporting properties, in particular for use in the interlayer, emission layer and/or charge-transport layer of electroluminescent devices. The invention furthermore relates to a process for the preparation of the compounds according to the invention and to electronic devices comprising these compounds.

21 Claims, No Drawings

MATERIALS FOR ORGANIC ELECTROLUMINESCENCE DEVICES

CROSS-REFERENCE TO RELATED APPLICATIONS

This application is a national stage application (under 35 U.S.C. §371) of PCT/EP2011/006046, filed Dec. 2, 2011, which claims benefit of German Application No. 10 2010 056 151.7, filed Dec. 28, 2010 which are both incorporated by reference.

The present invention relates to copolymers containing indenocarbazole derivatives having electron- and hole-transporting properties, in particular for use in the emission layer and/or charge-transport layer of electroluminescent devices. The invention furthermore relates to a process for the preparation of the compounds according to the invention and to electronic devices comprising these compounds.

In the past, predominantly small molecules were employed as useful components, for example as phosphorescence emitters, in organic electroluminescent devices. The use of small molecules in organic electroluminescent devices (SMOLEDs) enables good colour efficiencies, long lifetimes and the requisite low operating voltages. However, the disadvantage of such systems is the complex production. Thus, for example, the deposition of layers of small molecules requires complex processes, such as, for example, thermal coating processes, which results in a limited maximum device size.

For some time, conjugated polymers having the corresponding properties have therefore been used for opto-electronic applications, since they can be applied easily and inexpensively as a layer by spin coating or print coating. Conjugated polymers have already been investigated intensively for some time as highly promising materials in OLEDs. OLEDs which comprise polymers as organic materials are frequently also known as PLEDs (PLED=polymer light emitting diodes). Their simple production holds the promise of inexpensive production of corresponding electroluminescent devices.

PLEDs consist either only of one layer, which is able to combine as far as possible all functions (charge injection, charge transport, recombination and emission) of an OLED in itself, or they consist of a plurality of layers which comprise the respective functions individually or partially combined. For the preparation of polymers having the corresponding properties, the polymerisation is carried out using different monomers which take on the corresponding functions. Thus, it is generally necessary for the generation of all three emission colours to copolymerise certain monomers into the corresponding polymers. In order to generate white light by light mixing, light in the three colours red, green and blue is required. In order to ensure high light efficiency, triplet emitters (phosphorescence) are preferred to weaker-light singlet emitters (fluorescence). In accordance with the invention, conjugated polymers are only suitable as host materials for red- or yellow-emitting triplet emitters, but not for triplet emitters having relatively high energy (blue- or green-emitting triplet emitters), since the low triplet energies of the conjugated polymers quench the emission from any triplet emitters having relatively high energy (relatively short wavelengths).

In order to circumvent the said problem of quenching, use has been made of non-conjugated or partially conjugated polymers, which have a high triplet level. However, these have to date the disadvantage that the lifetime of such systems is unsatisfactory. Thus, for example, poly-N-vinyl-carbazole is a known system for a triplet emitter in the green region, but opto-electronic devices produced therefrom have extremely short lifetimes.

Thus, with the exception of triplet emitter polymers which emit in the deep-red region, no triplet OLEDs with a polymer matrix having a long lifetime and high emission efficiency have been provided to date.

Accordingly, it was an object of the present invention to provide polymers and compounds which enable simple and inexpensive production of light-efficient (especially in the green and/or (pale) blue spectral regions) organic electroluminescent devices having long lifetimes.

The invention is furthermore directed to PLEDs having an interlayer. Single-layered PLEDs, in which hole transport, electron transport and the emitter function are combined in one layer, are simple to produce, but have only short lifetimes.

le;2qWO 2004/084260 A2 discloses a PLED in which an improved lifetime compared with single-layered PLEDs has been achieved with an interlayer arranged between a hole-injection layer and an emission layer. An interlayer of this type usually has at least one hole-transport and electron-blocking function, but it is desirable to have further functions in the interlayer, in particular an exciton-blocking function, in order to keep the excitons in the emission layer. This is particularly desired in the case of triplet emitters. However, this makes high demands of the interlayer polymers, for example a suitable HOMO energy level, a high LUMO and a high triplet level is necessary. Interlayer polymers known from the prior art do not to date have these properties owing to their conjugation, in particular they have an inadequate triplet level and an excessively low LUMO.

A further object of the present invention therefore consisted in the provision of a suitable interlayer polymer and/or electron-blocking polymer for high-performance singlet and triplet OLEDs.

These objects have been achieved in accordance with the invention by a copolymer containing one or more structural units of the general formula (1), (2), (3), (4) and/or (5)

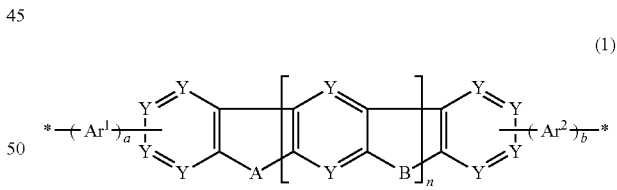

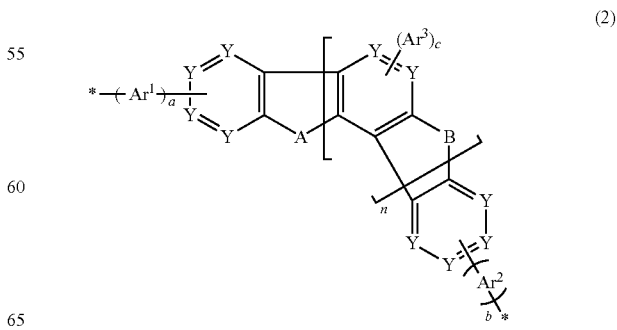

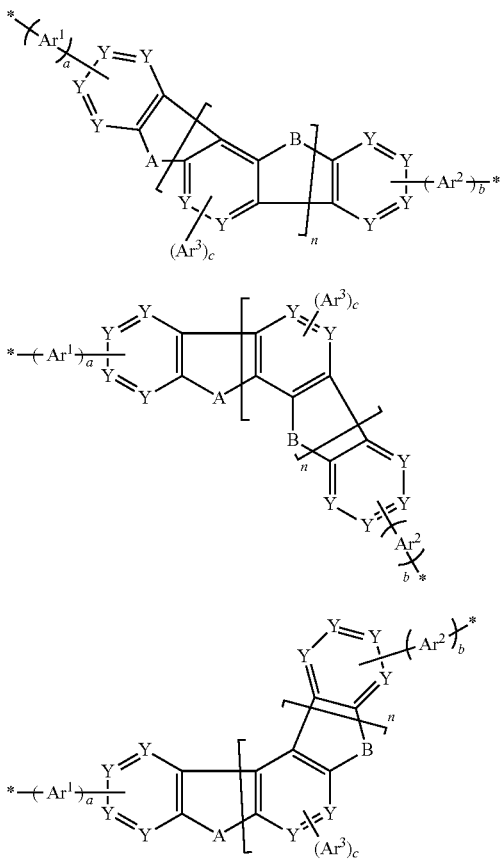

where the following applies to the symbols and indices:
A, B are selected, identically or differently on each occurrence, from the group consisting of —C($R^1$)$_2$, —Si($R^1$)$_2$, —N$R^1$, —O, —S, —C(=O), —S(=O), —SO$_2$, —CF$_2$, —SF$_4$, —P, —P(=O)$R^1$, —PF$_2$, —P(=S)$R^1$, —As, —As(=O), —As(=S), —Sb, —Sb(=O) and —Sb(=S);
Y is C if a group $Ar^1$, $Ar^2$ or $Ar^3$ is bonded to the group Y or is, identically or differently on each occurrence, C$R^1$ or N;
$R^1$ is, identically or differently on each occurrence, —H, —X, —CN, —NC, —NCO, —NCS, —OCN, —SCN, —C(=O)N($R^2$)$_2$, —C(=O)X, —C(=O)$R^1$, —NH$_2$, —N($R^2$)$_2$, —SH, —S$R^2$, —SO$_3$H, —SO$_2R^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent CH$_2$ groups may be replaced by $R^2$C=C$R^2$, C≡C, Si($R^2$)$_2$, Ge($R^2$)$_2$, Sn($R^2$)$_2$, C=O, C=S, C=Se, C=N$R^2$, P(=O)($R^2$), SO, SO$_2$, N$R^2$, O, S or CON$R^2$ and where one or more H atoms may be replaced by D, F, Cl, Br, I, CN or NO$_2$, or an aromatic or heteroaromatic group having 5 to 40 ring atoms, which may in each case be substituted by one or more radicals $R^2$, or an aromatic or heteroaromatic ring system having 5 to 40 aromatic ring atoms, which may in each case be substituted by one or more radicals $R^2$, or an aryloxy or heteroaryloxy group having 5 to 40 aromatic ring atoms, which may be substituted by one or more radicals $R^2$, or a combination of these systems; two or more substituents $R^1$ here may also form a mono- or polycyclic, aliphatic, aromatic or heteroaromatic ring system with one another, together with the atoms to which they are bonded, where two groups $R^1$ may also form a spiro group together with the fluorene unit to which they are bonded;
X is halogen;
$R^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;
$Ar^1$, $Ar^2$, $Ar^3$ are on each occurrence, identically or differently, an aromatic or heteroaromatic ring system having 5 to 40 ring atoms, which may be substituted by one or more radicals $R^1$, where the ring system may also be condensed onto positions 7,8 or 8,9 of the basic compound;
a, b, c are each, independently of one another, 0 or 1; and
n is greater than or equal to 1,
where the copolymer contains at least one structural unit which is different from the structural unit of the formula (1), (2), (3), (4) and/or (5).

It has been found that a copolymer which contains at least one structural unit of the formula (1), (2), (3), (4) and/or (5) can serve as matrix material for blue-, green- and red (orange)-emitting triplet emitters, where their emission is not quenched, so that the high emission efficiency of the triplet emitters is retained. In addition, the solubility of the resultant polymers can be tuned correspondingly through the choice of suitable substituents in the formula (1), (2), (3), (4) or (5), so that the layer application of the polymers for organic electroluminescent devices can be accomplished in a simple and inexpensive process.

It has furthermore been found that a copolymer which contains at least one structural unit of the formula (1), (2), (3), (4) and/or (5) can serve as interlayer polymer, where the copolymer has an exciton-blocking function.

For the purposes of the present invention, an alkyl group having 1 to 40 C atoms, in which, in addition, individual H atoms or CH$_2$ groups may also be substituted by —$R^2$C=C$R^2$—, —C≡C—, Si($R^2$)$_2$, Ge($R^2$)$_2$, Sn($R^2$)$_2$, C=O, C=S, C=Se, C=N$R^2$, —O—, —S—, —COO— or —CON$R^2$—, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl and 2,2,2-trifluoroethyl. An alkenyl group in the sense of the present invention is taken to mean, in particular, ethenyl, propenyl, butenyl, pentenyl, cyclopentenyl, hexenyl, cyclohexenyl, heptenyl, cycloheptenyl, octenyl and cyclooctenyl. An alkynyl group in the sense of the present invention is taken to mean, in particular, ethynyl, propynyl, butynyl, pentynyl, hexynyl and octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy and 2-methylbutoxy.

Halogen in the present invention is taken to mean fluorine, chlorine, bromine or iodine, where chlorine, bromine and iodine are preferred and bromine and iodine are particularly preferred.

An aryl group or aromatic group in the sense of the present invention preferably contains 5 to 40 C atoms, particularly preferably 5 to 25 C atoms, and in particular 6 to 20 C atoms; a heteroaryl-group or heteroaromatic group in the sense of the present invention preferably contains 2 to 40 C atoms and at least one heteroatom, particularly preferably 3 to 25 C atoms and at least one heteroatom, and in particular 5 to 20 C atoms and at least one heteroatom, with the proviso that the sum of C atoms and heteroatoms is at least 5. The heteroatoms are preferably selected from N, O and/or S. An aryl group or heteroaryl group here is taken to mean a simple aromatic ring, i.e. benzene, or a simple heteroaromatic ring, for example pyridine, pyrimidine, triazine and thiophene, or a polycyclic condensed aryl or heteroaryl group, for example naphthalene, anthracene, phenanthrene, benzanthracene, quinoline, isoquinoline, benzothiophene, benzofuran and indole.

An aromatic ring system in the sense of the present invention preferably contains 5 to 40 C atoms, particularly preferably 5 to 25 C atoms, and in particular 6 to 20 C atoms in the ring system. A heteroaromatic ring system in the sense of the present invention preferably contains 2 to 40 C atoms and at least one heteroatom in the ring system, particularly preferably 3 to 25 C atoms and at least one heteroatom, and in particular 5 to 20 C atoms and at least one heteroatom, with the proviso that the sum of C atoms and heteroatoms is at least 5. The heteroatoms are preferably selected from N, O and/or S. An aromatic or heteroaromatic ring system in the sense of the present invention is, in addition, intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diaryl ether and stilbene are also taken to be aromatic ring systems in the sense of the present invention, as are systems in which two or more aryl groups are interrupted, for example, by a linear or cyclic alkyl group or by a silyl group.

An aromatic or heteroaromatic ring system having 5 to 40 ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, pyrene, chrysene, benzanthracene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, cis- or trans-indenocarbazole, cis- or trans-indolocarbazole, pyridine, quinoline, isoquinoline, acridine, phenanthridiene, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The aromatic or heteroaromatic ring system may be monocyclic or polycyclic, i.e. it may have one ring (for example phenyl) or two or more rings, which may be condensed (for example naphthyl) or covalently linked (for example biphenyl), or contain a combination of condensed and linked rings. Fully conjugated ring systems are preferred.

In the present application, the term "polymer" or "copolymer" is taken to mean both polymeric compounds, oligomeric compounds and dendrimers. The polymeric compounds according to the invention preferably have 10 to 10,000, particularly preferably 20 to 5000 and in particular 50 to 2000 structural units. The oligomeric compounds according to the invention preferably have 2 to 9 structural units. The branching factor of the polymers here is between 0 (linear polymer, no branching sites) and 1 (fully branched dendrimer).

According to a preferred embodiment of the present invention, the structural units of the formulae (1), (2), (3), (4) or (5) correspond to the structural units of the formulae (1a), (2a), (3a), (4a) or (5a)

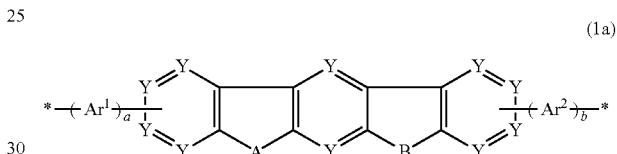

(1a)

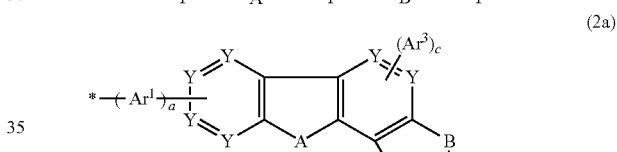

(2a)

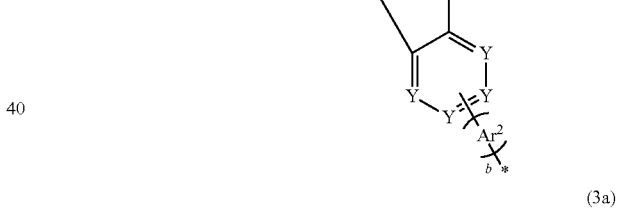

(3a)

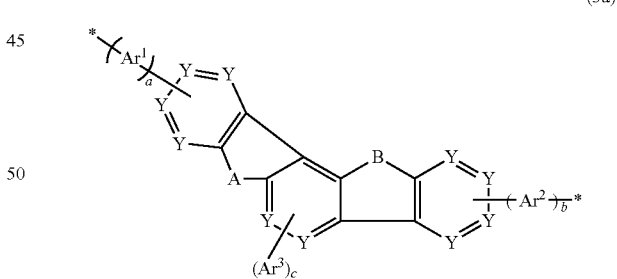

(4a)

-continued (5a)
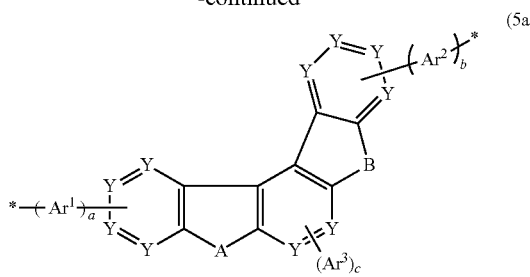

where the symbols and indices have the meanings indicated above.

According to a further preferred embodiment of the present invention, the structural units of the formulae (1), (2), (3), (4) or (5) correspond to the structural units of the formulae (1b), (2b), (3b), (4b) or (5b)

(1b)
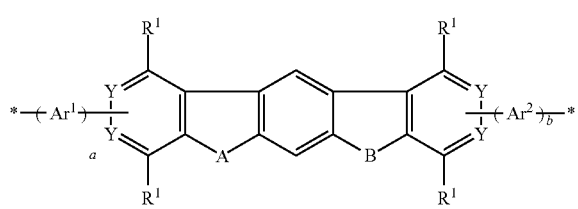

(2b)
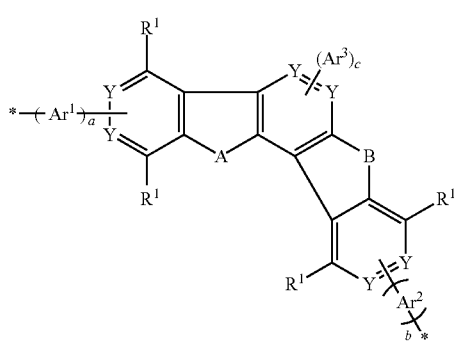

(3b)
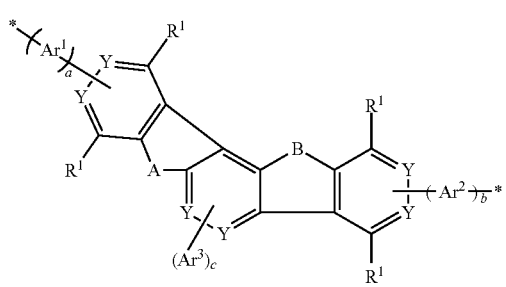

(4b)
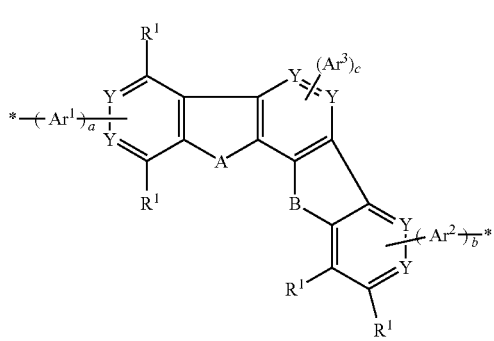

-continued (5b)
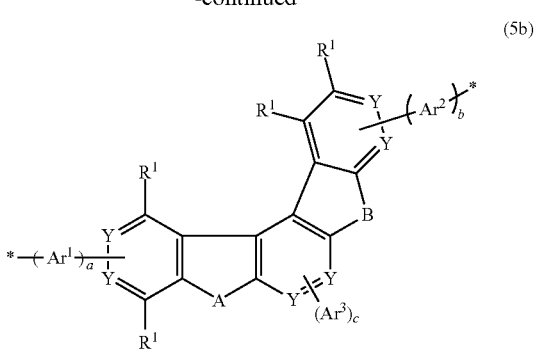

where the symbols and indices have the meanings indicated above.

According to a particularly preferred embodiment, the structural units of the formulae (1), (2), (3), (4) or (5) correspond to the structural units of the formulae (1c), (2c), (3c), (4c) or (5c)

(1c)
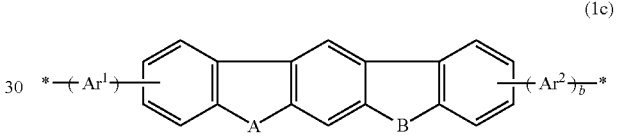

(2c)
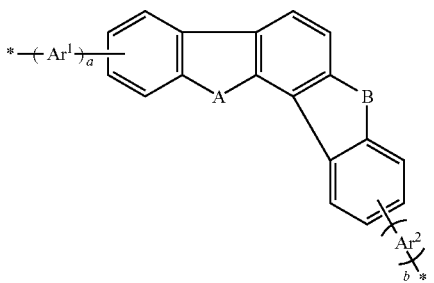

(3c)
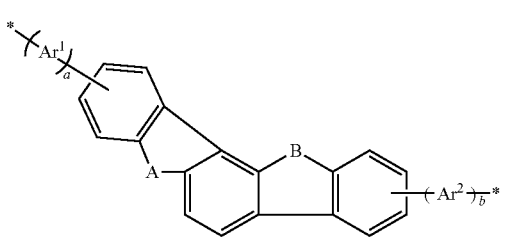

(4c)
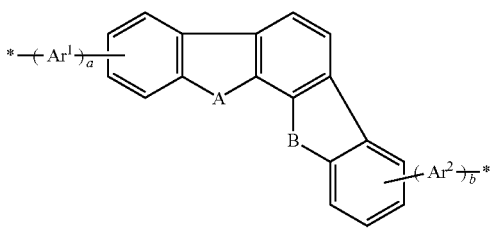

-continued

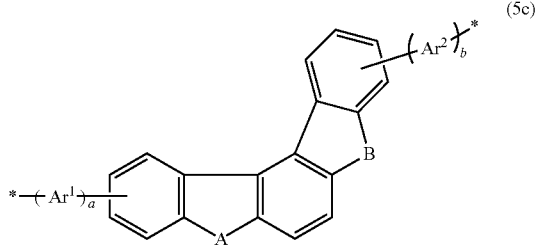

(5c)

where the symbols and indices have the meanings indicated above.

In a further embodiment according to the invention, the proportion of the structural units of the formula (1), (2), (3), (4) or (5) in the copolymer is less than 100 mol %, preferably up to 95 mol %, particularly preferably up to 80 mol % and in particular up to 60 mol %. Likewise in a preferred embodiment, the proportion of the structural units of the formula (1), (2), (3), (4) or (5) in the copolymer is at least 0.01 mol %, preferably at least 1 mol %, particularly preferably at least 10 mol % and in particular at least 30 mol %.

The number-average molecular weight $M_n$ of the copolymer according to the invention is preferably in the range from 4000 to 2000000 g/mol, particularly preferably in the range from 5000 to 1500000 g/mol, and in particular in the range from 6000 to 1000000 g/mol. The number-average molecular weight $M_n$ is determined by GPC (gel permeation chromatography) using an internal polystyrene standard.

The copolymers may be conjugated, partially conjugated or non-conjugated. The copolymers may be linear, branched or dendritic. In the structures linked in a linear manner, the structural units of the formula (1), (2), (3), (4) or (5) can either be linked directly to one another or they can be linked to one another via a divalent group, for example via a substituted or unsubstituted alkylene group, via a heteroatom or via a divalent aromatic or heteroaromatic group. In branched structures, for example, three or more structural units of the formula (1), (2), (3), (4) or (5) can be linked via a trivalent or polyvalent group, for example via a trivalent or polyvalent aromatic or heteroaromatic group, to form a branched cooligomer or copolymer.

Partially conjugated copolymers can preferably be random copolymers or block copolymers comprising the structural unit according to the invention and at least one further monomer unit. Groups which can be employed as further monomer unit are described below. In the case of partially conjugated copolymers, at least one of the further structural units (monomer units) which is different from the structural unit according to the invention contributes to the copolymer forming a conjugated system, at least in parts.

It is preferred with respect to the emission efficiency of triplet emitters for the copolymer to be non-conjugated. The non-conjugated polymer may also be a random or alternating copolymer or block copolymer comprising the structural unit of the formula (1), (2), (3), (4) or (5) and at least one further monomer unit which is different from the structural units according to the invention. In the case of the random copolymer and the block copolymer, the further structural units are preferably units which are themselves non-conjugated or whose conjugation is interrupted by a short non-aromatic unit (<10% of the atoms other than H, preferably <5% of the atoms other than H), such as, for example, C (sp$^3$-hybridised), N, O, Si, P, S, Ge (e.g.: CR$_2$, C=O, NR, O, SiR$_2$, P=O, S and GeR$_2$, where R is selected from the group consisting of H, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group). In the case of the alternating copolymer, the further structural units may also be units which are conjugated per se.

The copolymers according to the invention may also, besides one or more structural units of the formula (1), (2), (3), (4) or (5), contain at least one further structural unit which are different from the structural unit of the formula (1), (2), (3), (4) or (5). These are, inter alia, those as disclosed and listed extensively in WO 02/077060 A1 and in WO 2005/014689 A2. These are incorporated into the present application by way of reference. The further structural units can originate, for example, from the following classes:

Group 1: Units which influence the hole-injection and/or hole-transport properties of the polymers/copolymers;
Group 2: Units which influence the electron-injection and/or electron-transport properties of the polymers/copolymers;
Group 3: Units which have combinations of individual units from group 1 and group 2;
Group 4: Units which modify the emission characteristics to such an extent that electrophosphorescence can be obtained instead of electrofluorescence;
Group 5: Units which improve transfer from the singlet state to the triplet state;
Group 6: Units which influence the emission colour of the resultant polymers/copolymers;
Group 7: Units which are typically used as backbone;
Group 8: Units which influence the film-morphological and/or rheological properties of the resultant polymers/copolymers.

Preferred copolymers according to the invention are those in which at least one structural unit has charge-transport properties, i.e. which contain units from groups 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the copolymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the copolymer preferably result in an LUMO of less than −1.9 eV (against vacuum level), particularly preferably less than −2.5 eV.

It may be preferred for the copolymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4, so-called triplet emitter units, are those which are able to emit light from the triplet state with high efficiency, even at room temperature, i.e. exhibit electrophosphorescence instead of electrofluorescence, which frequently causes an increase in the energy efficiency. A triplet emitter unit in the sense of the present invention is taken to mean a compound which comprises a triplet emitter. Triplet emitters in the sense of the present invention are taken to mean all compounds which are capable of emitting light in the visible or NIR region through transfer from a triplet state into an energetically lower state. This is also referred to as phosphorescence. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the copolymers according to the invention here are, for example, various complexes, as described, for example, in WO 02/068435 A1, WO 02/081488 A1 and EP 1239526 A2. Corresponding monomers are described in WO 02/068435 A1 and in WO 2005/042548 A1.

It is preferred in accordance with the invention to employ triplet emitters which emit in the visible spectral region (red, green or blue).

The triplet emitter may be part of the backbone of the copolymer (i.e. in the main chain of the copolymer) or it may be located in a side chain of the copolymer.

Structural units from group 5 are those which improve transfer from the singlet state to the triplet state and which, employed in support of the above-mentioned triplet emitter units, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant copolymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivativesfluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but in principle also all similar structures which, after polymerisation, would result in a conjugated, bridged or unbridged polyphenylene or polyphenylene-vinylene homopolymer. Here too, the said aromatic structure may contain heteroatoms, such as O, S or N, in the backbone or a side chain.

Structural units from group 8 are those which influence the film-morphological properties and/or the rheological properties of the copolymers, such as, for example, siloxanes, long alkyl chains or fluorinated groups, but also particularly rigid or flexible units, such as, for example, liquid crystal-forming units or crosslinkable groups.

The syntheses of the above-described units from groups 1 to 8 and of the further emitting units are known to the person skilled in the art and are described in the literature, for example in WO 2005/014689 A2, WO 2005/030827 A1 and WO 2005/030828 A1. These documents and the literature cited therein are incorporated into the present application by way of reference.

Preference is given to copolymers according to the invention which simultaneously, besides structural units of the formula (1), (2), (3), (4) or (5), additionally contain one or more units selected from groups 1 to 8. It may furthermore be preferred for more than one structural unit from one group to be present simultaneously.

However, a smaller proportion of the emitting units, in particular green- and red-emitting units, may also be preferred, for example for the synthesis of white-emitting copolymers. The way in which white-emitting copolymers can be synthesised is described in detail, for example, in WO 2005/030827 A1 and WO 2005/030828 A1.

Preference is given here to polymers according to the invention which, besides at least one structural unit of the formula (1), (2), (3), (4) or (5), also contain units from group 7. The sum of structural units of the formula (1), (2), (3), (4) or (5) and units from group 7 in the polymer is particularly preferably at least 50 mol %, based on all units in the copolymer.

It is likewise preferred for the copolymers according to the invention to contain units which improve the charge transport and/or charge injection, i.e. units from groups 1 and/or 2; a proportion of 0.5 to 30 mol % of these units is particularly preferred; a proportion of 1 to 10 mol % of these units is very particularly preferred.

It is furthermore particularly preferred for the copolymers according to the invention to contain structural units from group 7 and units from groups 1 and/or 2. The sum of structural units of the formula (1), (2), (3), (4) or (5), units from group 7 and units from groups 1 and/or 2 in the copolymer is particularly preferably at least 50 mol %, based on all units in the polymer, where 0.5 to 30 mol % of units are preferably from groups 1 and/or 2.

The way in which the above-mentioned copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the copolymer may also have dendritic structures.

The copolymers according to the invention containing structural units of the formula (1), (2), (3), (4) or (5) are accessible readily and in high yields.

If triplet emitter units are employed in the copolymers according to the invention, they have advantageous properties, in particular long lifetimes, high efficiencies and good colour coordinates.

The copolymers according to the invention are generally prepared by polymerisation of more than one type of monomer, of which at least one monomer results in structural units of the formula (1), (2), (3), (4) or (5) in the polymer. Suitable polymerisation reactions are known to the person skilled in the art and are described in the literature. Particularly suitable and preferred polymerisation reactions which result in C—C or C—N links are the following:
(A) SUZUKI polymerisation;
(B) YAMAMOTO polymerisation;
(C) STILLE polymerisation;
(D) HECK polymerisation;
(E) NEGISHI polymerisation;
(F) SONOGASH IRA polymerisation;
(G) HIYAMA polymerisation; and
(H) HARTWIG-BUCHWALD polymerisation.

The way in which the polymerisation can be carried out by these methods and the way in which the copolymers can then be separated off from the reaction medium and purified is known to the person skilled in the art and is described in detail in the literature, for example in WO 03/048225 A2, WO 2004/037887 A2 and WO 2004/037887 A2.

In order to be able to polymerise the structural units of the formula (1), (2), (3), (4) or (5) and the further structural units, the structural units preferably contain leaving groups which are accessible to a coupling reaction, preferably a metal-catalysed cross-coupling reaction. The compounds functionalised with the leaving groups represent the basis for polymerisation. Thus, bromine derivatives can be reacted with arylboronic acids or arylboronic acid derivatives by Suzuki coupling or with organotin compounds by a Stille reaction to give the corresponding cooligomers, copolymers or dendrimers.

These processes are known in the prior art. Thus, the Suzuki coupling is, for example, a cross-coupling reaction, where arylboronic acids are preferably reacted with haloaromatic compounds with catalytic use of, preferably, palladium-phosphine complexes. The reactivity of the aromatic compounds increases from bromine via trifluoromethanesulfonic acid esters to iodine, where in the meantime even weakly reactive chloroaromatic compounds can be reacted with palladium-phosphine catalysts. The Stille cross-coupling reaction proceeds analogously, using organotin compounds instead of organoboron compounds, although the former are not preferred owing to their high toxicity.

For the purposes of the present invention, particular preference is given to structural units of the formula (1), (2), (3), (4) or (5) which are substituted by reactive leaving groups, such as bromine, iodine, boronic acid, boronic acid ester, tosylate or triflate. The polymerisation here is preferably carried out via the halogen functionality or the boronic acid functionality.

The C—C linking reactions are preferably selected from the group of the SUZUKI coupling, the YAMAMOTO coupling and the STILLE coupling, and the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, for example in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterisation of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

For the synthesis of the copolymers according to the invention, the corresponding monomers are required. Monomers which result in structural units of the formula (1), (2), (3), (4) or (5) in the polymers according to the invention are compounds which are correspondingly substituted and have, in two positions, suitable functionalities which allow this monomer unit to be incorporated into the polymer. These monomers are novel and are therefore likewise a subject-matter of the present application.

It may additionally be preferred to use the polymers according to the invention not as the pure substance, but instead as a mixture together with further polymeric, oligomeric, dendritic or low-molecular-weight substances of any desired type. These may, for example, improve the electronic properties or themselves emit. Above and below, a mixture is taken to mean a composition which comprises at least one polymeric component.

The present invention thus furthermore relates to a polymer mixture which comprises one or more copolymers according to the invention and one or more further polymeric, oligomeric, dendritic or low-molecular-weight substances.

In a further embodiment of the present invention, it is preferred for a mixture to comprise a copolymer according to the invention and a low-molecular-weight substance. The low-molecular-weight substance is preferably a triplet emitter.

In a further embodiment, it is preferred for the copolymer which contains structural units of the formula (1), (2), (3), (4) and/or (5) to be employed in an emitting layer together with an emitting compound. In this case, the polymer is preferably employed in combination with one or more phosphorescent materials (triplet emitters). For the purposes of the present invention, phosphorescence is taken to mean the luminescence from an excited state of relatively high spin multiplicity, i.e. a spin state >1, in particular from an excited triplet state or from an MLCT mixed state. The mixture comprising the copolymer according to the invention or the preferred embodiment mentioned above and the emitting compound then comprises between 99 and 1% by weight, preferably between 98 and 60% by weight, particularly preferably between 97 and 70% by weight, in particular between 95 and 75% by weight, of the copolymer according to the invention or of the preferred embodiment mentioned above, based on the entire mixture comprising emitter and matrix material. Correspondingly, the mixture comprises up to 99% by weight, preferably up to 40% by weight, particularly preferably up to 30% by weight and in particular up to 25% by weight, of the emitter, based on the entire mixture comprising emitter and matrix material. In addition, the mixture comprises at least 1% by weight, preferably at least 2% by weight, particularly preferably at least 3% by weight and in particular at least 5% by weight, of the emitter, based on the entire mixture comprising emitter and matrix material.

In the above-mentioned embodiment in which the copolymer which contains structural units of the formula (1), (2), (3), (4) and/or (5) is employed in an emitting layer together with an emitting compound, the proportion of the emitting compound may, however, also be significantly lower. In this case, the mixture preferably comprises at least 0.01% by weight of the emitter, based on the entire mixture, but preferably less than 5% by weight, particularly preferably less than 3% by weight and in particular less than 1.5% by weight of the emitter, based on the entire mixture.

Suitable phosphorescent compounds are, in particular, compounds which emit light, preferably in the visible region, on suitable excitation and in addition contain at least one atom having an atomic number of greater than 36 and less than 84, particularly preferably greater than 56 and less than 80.

Examples of the emitters described above are revealed by the applications WO 00/70655, WO 01/41512, WO 02/02714, WO 02/15645, EP 1191613, EP 1191612, EP 1191614, WO 05/033244 and DE 102008015526. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without an inventive step.

For the purposes of the present invention, the emitter compound in the composition according to the invention is preferably a green-emitting triplet emitter. The triplet emitter may likewise be a blue or red triplet emitter.

In a further embodiment according to the invention, the triplet emitter preferably contains an organometallic connecting unit. The organometallic connecting unit is preferably an organometallic coordination compound. In the present application, an organometallic coordination compound is taken to mean a compound having a metal atom or ion in the centre of the compound surrounded by an organic compound as ligand. In addition, an organometallic coordination compound is characterised in that at least one carbon atom of the ligand is bonded to the central metal via a coordination bond. Electrically neutral triplet emitters are furthermore preferred.

The triplet emitters preferably contain only chelating ligands, i.e. ligands which coordinate to the metal via at least two bonding sites; the use of two or three bidentate ligands, which may be identical or different, is particularly preferred. The preference for chelating ligands is due to the higher stability of chelate complexes.

In a further embodiment of the present invention, it is preferred for the copolymer according to the invention which contains structural units of the formula (1), (2), (3), (4) and/or (5) to be employed in an interlayer. The copolymer here preferably has an exciton- and/or electron-blocking function.

In a further embodiment according to the invention, it is preferred for a mixture to comprise a copolymer according to the invention, a triplet emitter, which is either present in the copolymer according to the invention or, as in the above-mentioned embodiments, has been admixed as low-molecular-weight substance, and further low-molecular-weight substances. These low-molecular-weight substances may have the same functionalities as mentioned for possible monomer units from groups 1 to 8.

The present invention furthermore relates to solutions and formulations comprising one or more copolymers or mixtures according to the invention in one or more solvents. The way in which solutions of this type can be prepared is known to the person skilled in the art and is described, for example, in WO 02/072714 A1, WO 03/019694 A2 and the literature cited therein.

These solutions can be used to produce thin polymer layers, for example by area-coating processes (for example spin coating) or by printing processes (for example ink-jet printing).

Copolymers which contain structural units of the formula (1), (2), (3), (4) and/or (5) which contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to copolymers according to the invention containing one or more polymerisable groups, selected from acrylate, methacrylate, vinyl, epoxy and oxetane. It is possible here not only to use corresponding copolymers as the pure substance, but also to use formulations or blends of these copolymers as described above. These can be used with or without addition of solvents and/or binders. Suitable materials, processes and devices for the methods described above are described, for example, in WO 2005/083812 A2. Possible binders are, for example, polystyrene, polycarbonate, polyacrylates, polyvinylbutyral and similar, opto-electronically neutral polymers.

Suitable and preferred solvents are, for example, toluene, anisoles, xylenes, methyl benzoate, dimethylanisoles, mesitylenes, tetralin, veratrol and tetrahydrofuran or mixtures thereof.

The copolymers, mixtures and formulations according to the invention can be used in electronic or electro-optical devices or for the production thereof.

The present invention thus furthermore relates to the use of the copolymers, mixtures and formulations according to the invention in electronic or electro-optical devices, preferably in organic or polymeric organic electroluminescent devices (OLED, PLED), organic field-quench devices (O-FQDs), light-emitting electrochemical cells (OLECs), organic field-effect transistors (OFETs), dye-sensitised organic solar cells (ODSSCs), organic integrated circuits (O-ICs), organic thin-film transistors (TFTs), organic light-emitting transistors (O-LETs), organic solar cells (O-SCs), organic laser diodes (O-lasers), organic plasmon emitting devices, organic photovoltaic (OPV) elements or devices or organic photoreceptors (OPCS), particularly preferably in organic or polymeric organic electroluminescent devices (OLED, PLED and OLEC), in particular in polymeric organic electroluminescent devices (PLED and OLEC).

As described above, the copolymers according to the invention are very particularly suitable as electroluminescent materials in PLEDs or displays produced in this way.

For the purposes of the present invention, electroluminescent materials are taken to mean materials which can be used as active layer. Active layer means that the layer is capable of emitting light on application of an electric field (light-emitting layer) and/or that it improves the injection and/or transport of positive and/or negative charges (charge-injection or charge-transport layer), or that it has an electron- and/or exciton-blocking function (interlayer).

The present invention therefore also preferably relates to the use of the copolymers or mixtures according to the invention in a PLED, in particular as electroluminescent material, particularly preferably as triplet matrix material or interlayer.

The present invention furthermore relates to electronic or opto-electronic components, preferably organic or polymeric organic electroluminescent devices (OLED, PLED, OLEC), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCS), particularly preferably organic or polymeric organic electroluminescent devices, in particular polymeric organic electroluminescent devices, having one or more active layers, where at least one of these active layers comprises one or more copolymers according to the invention. The active layer can be, for example, an emission layer, an interlayer, a charge-transport layer and/or a charge-injection layer, preferably an emission layer or an interlayer.

The present invention furthermore relates to an organic electronic device comprising in at least one active layer a polymer containing one or more structural units of the general formula (1), (2), (3), (4) and/or (5)

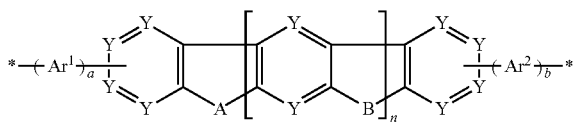
(1)

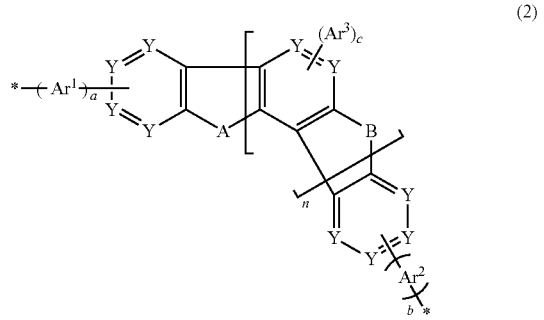
(2)

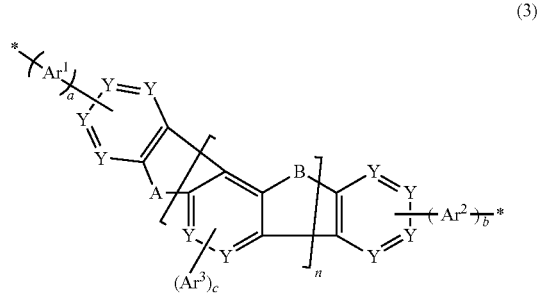
(3)

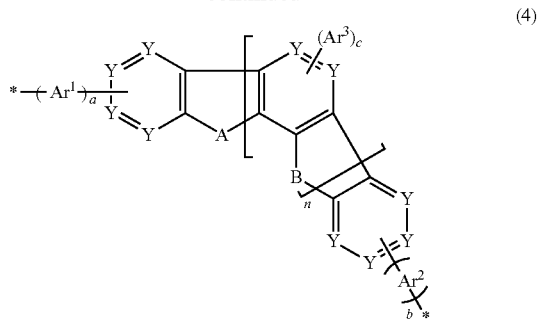
(4)

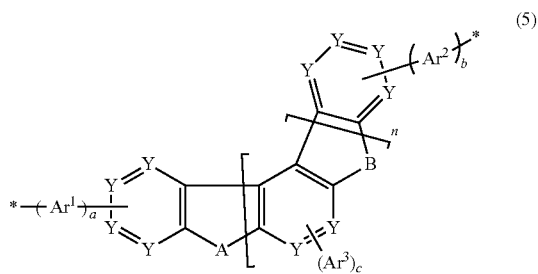
(5)

where the following applies to the symbols and indices:

A, B are selected, identically or differently on each occurrence, from the group consisting of —C(R$^1$)$_2$, —Si(R$^1$)$_2$, —NR$^1$, —O, —S, —C(=O), —S(=O), —SO$_2$, —CF$_2$, —SF$_4$, —P, —P(=O)R$^1$, —PF$_2$, —P(=S)R$^1$, —As, —As(=O), —As(=S), —Sb, —Sb(=O) and —Sb(=S);

Y is C if a group Ar$^1$, Ar$^2$ or Ar$^3$ is bonded to the group Y or is, identically or differently on each occurrence, CR$^1$ or N;

R$^1$ is, identically or differently on each occurrence, —H, —X, —CN, —NC, —NCO, —NCS, —OCN, —SCN, —C(=O)N(R$^2$)$_2$, —C(=O)X, —C(=O)R$^1$, —NH$_2$, —N(R$^2$)$_2$, —SH, —SR$^2$, —SO$_3$H, —SO$_2$R$^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by D, F, Cl, Br, I, CN or NO$_2$, or an aromatic or heteroaromatic group having 5 to 40 ring atoms, which may in each case be substituted by one or more radicals R$^2$, or an aromatic or heteroaromatic ring system having 5 to 40 aromatic ring atoms, which may in each case be substituted by one or more radicals R$^2$, or an aryloxy or heteroaryloxy group having 5 to 40 aromatic ring atoms, which may be substituted by one or more radicals R$^2$, or a combination of these systems; two or more substituents R$^1$ here may also form a mono- or polycyclic, aliphatic, aromatic or heteroaromatic ring system with one another, together with the atoms to which they are bonded, where two groups R$^1$ may also form a spiro group together with the fluorene unit to which they are bonded;

X is halogen;

R$^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

Ar$^1$, Ar$^2$, Ar$^3$ are on each occurrence, identically or differently, an aromatic or heteroaromatic ring system having 5 to 40 ring atoms, which may be substituted by one or more radicals R$^1$, where the ring system may also be condensed onto positions 7,8 or 8,9 of the basic compound;

a, b, c are each, independently of one another, 0 or 1; and n is greater than or equal to 1.

In a preferred embodiment of the organic electronic device, the structural units of the formulae (1), (2), (3), (4) or (5) correspond to the structural units of the formulae (1a), (2a), (3a), (4a) or (5a)

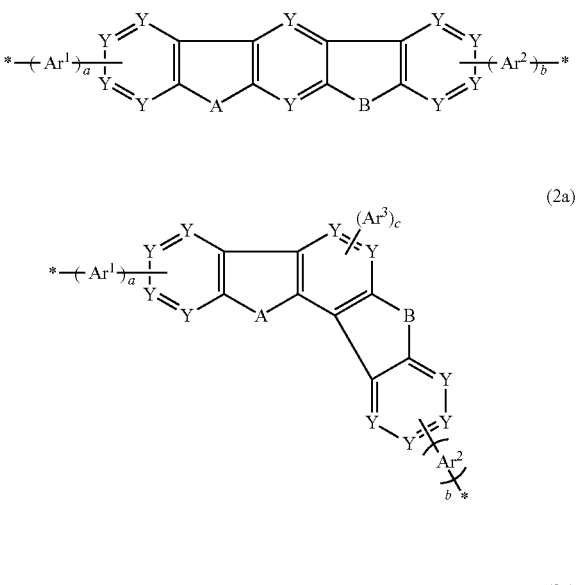

(1a)

(2a)

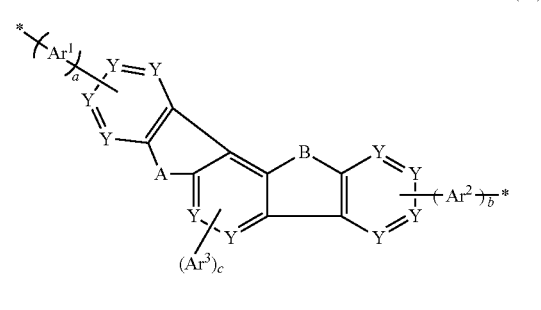

(3a)

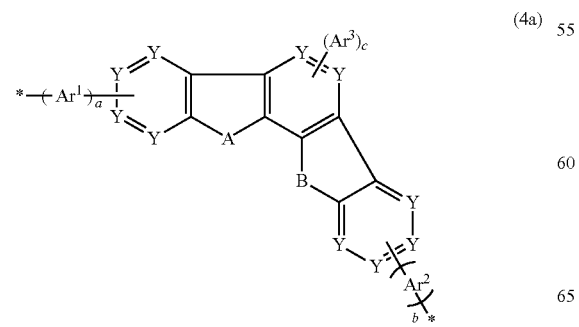

(4a)

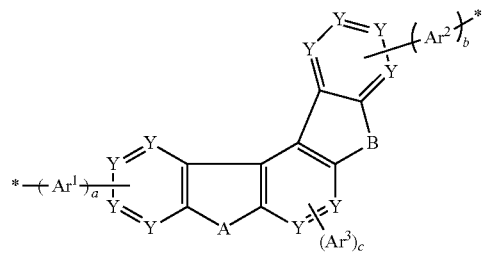

(5a)

where the symbols and indices have the meanings indicated above.

In a further preferred embodiment of the organic electronic device according to the invention, the structural units of the formulae (1), (2), (3), (4) or (5) correspond to the structural units of the formulae (1b), (2b), (3b), (4b) or (5b)

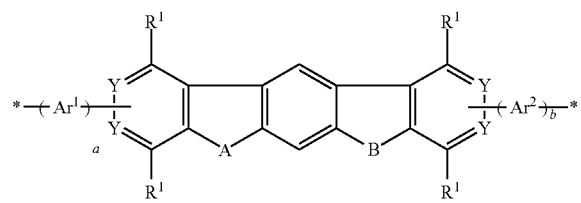

(1b)

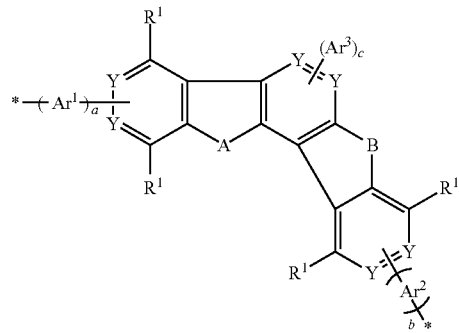

(2b)

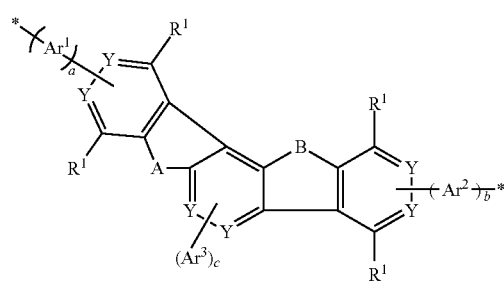

(3b)

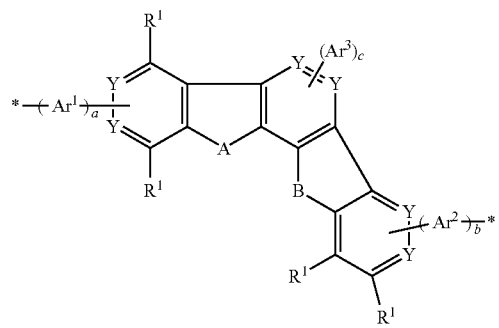

(4b)

-continued

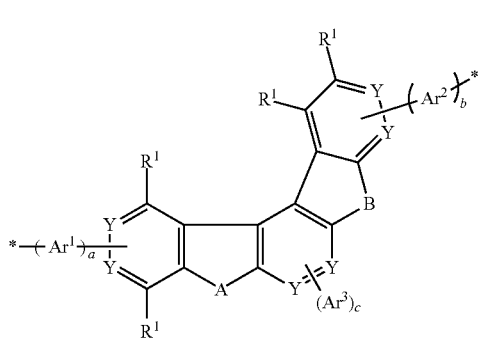
(5b)

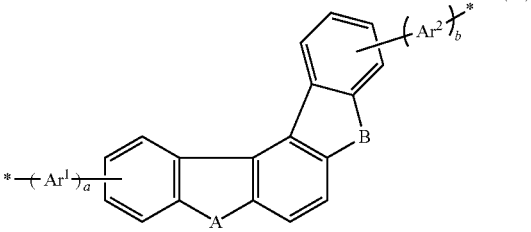
(5c)

where the symbols and indices have the meanings indicated above.

In a particularly preferred embodiment of the organic electronic device according to the invention, the structural units of the formulae (1), (2), (3), (4) or (5) correspond to the structural units of the formulae (1c), (2c), (3c), (4c) or (5c)

(1c)

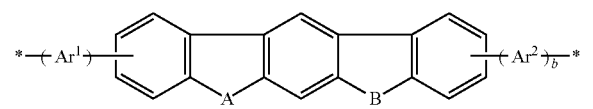
(2c)

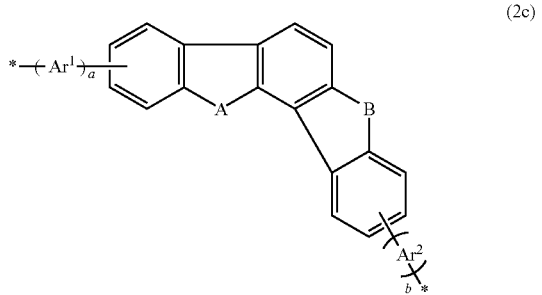
(3c)

(4c)

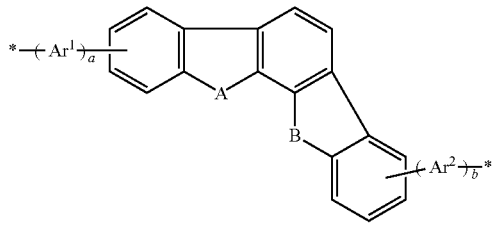

where the symbols and indices have the meanings indicated above.

In a further embodiment of the organic electronic device, it is preferred for A and B to be selected, identically or differently on each occurrence, from $C(R^1)_2$, $NR^1$, O, S or C(=O).

The way in which OLEDs or PLEDs can be produced is known to the person skilled in the art and is described in detail, for example, as a general process in WO 2004/070772 A2, which should be adapted correspondingly for the individual case.

In a further embodiment of the present invention, the device comprises a plurality of layers. These can be layers which comprise the copolymer according to the invention or layers which comprise polymers, blends or low-molecular-weight compounds which are independent thereof. The copolymer or polymer according to the invention can be present here in the form of an interlayer, hole-transport, hole-injection, emitter, electron-transport, electron-injection, charge-blocking and/or charge-generation layer, preferably as emitter layer/emission layer or interlayer.

The organic electroluminescent device may preferably comprise one emitting layer, or it may comprise a plurality of emitting layers, where at least one emitting layer comprises at least one copolymer according to the invention, as described above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013). White-emitting devices are suitable, for example, as lighting or backlighting of displays (LCDs).

Apart from these layers, it may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). It is likewise possible for interlayers, which have, for example, an exciton-blocking function, to be introduced between two emitting layers. However, it should be pointed out that each of these layers does not necessarily have to be present. These layers may likewise comprise the copolymers according to the invention, as defined above. It is also possible for a plurality of OLEDs to be arranged one above the other, which enables a further increase in efficiency with respect to the light yield to be achieved. In order to improve the coupling-out of light, the final organic layer on the light exit side in OLEDs can also be designed as a nanofoam, which reduces the proportion of total reflection.

The device may furthermore comprise layers which are built up from small molecules (SMOLEDs). These can be produced by evaporation of small molecules in a high vacuum.

Preference is thus furthermore given to an organic electroluminescent device in which one or more layers are coated by means of a sublimation process, in which the materials are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electroluminescent device which is characterised in that one or more layers are coated by means of the OVPD (organic vapour phase deposition) process or with the aid of carrier-gas sublimation, where the materials are applied at a pressure of between $10^{-5}$ mbar and 1 bar.

Preference is furthermore given to an organic electroluminescent device in which one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

The device usually comprises a cathode and an anode (electrodes). For the purposes of the present invention, the electrodes (cathode, anode) are selected in such a way that their potential matches as closely as possible the potential of the adjacent organic layer in order to ensure highly efficient electron or hole injection.

The cathode preferably comprises metal complexes, metals having a low work function, metal alloys or multilayered structures containing various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm, particularly preferably between 2 and 8 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (O-SCs) or the coupling-out of light (OLEDs/PLEDs, O-lasers). A preferred construction uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers.

The device is correspondingly structured in a manner known per se, depending on the application, provided with contacts and finally hermetically sealed, since the lifetime of such devices is drastically shortened in the presence of water and/or air.

The present application text and also the examples below are principally directed to the use of the copolymers according to the invention in relation to PLEDs and corresponding displays. In spite of this restriction of the description, it is possible for the person skilled in the art, without further inventive step, also to use the copolymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the Claims, unless stated otherwise elsewhere.

WORKING EXAMPLES

Example 1

Preparation of Compound 4 (M2)
Compound 4 is prepared as follows:

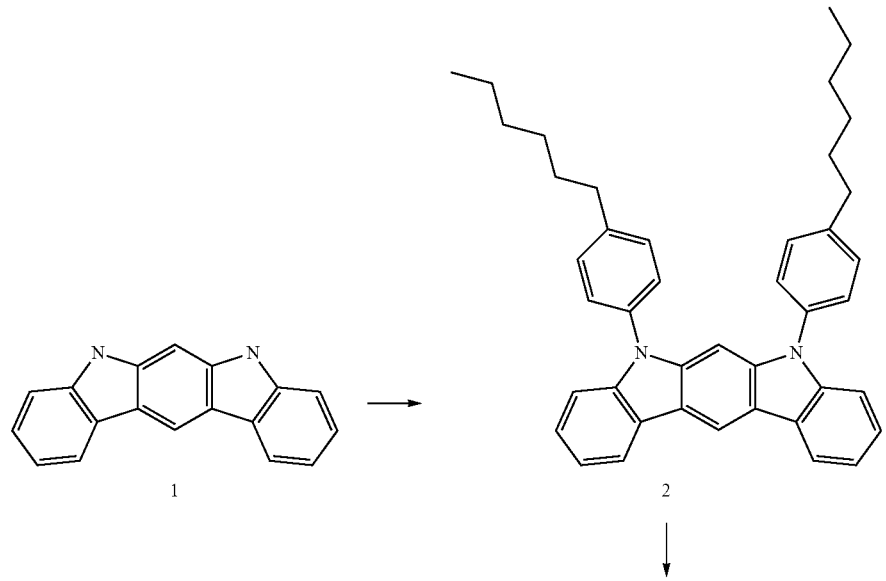

1.1 Compound 2

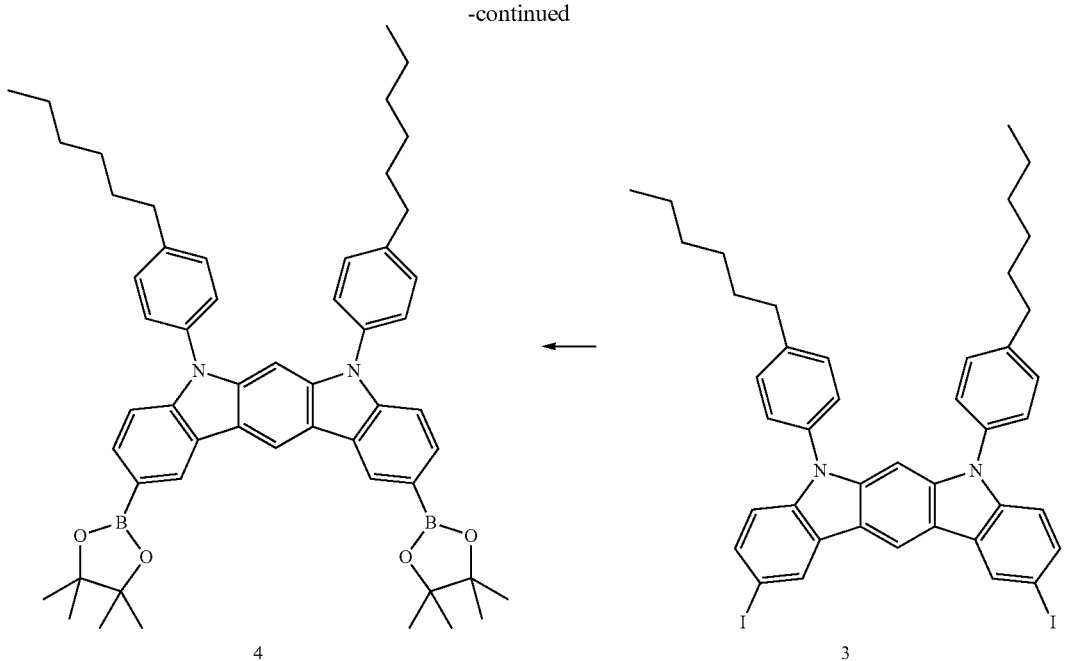

7.6 g (1 molar equivalent, 29.7 mmol) of indolocarbazole, 15.1 g (2.1 molar equivalents, 62.3 mmol) and 8.8 g of Na tert-butoxide are initially introduced in 100 ml of o-xylene and carefully degassed. The reaction solution is warmed to 130° C., and 133 mg of palladium acetate and 1.8 ml of 10% tributylphosphine solution in toluene (1 mol/l) are added, and the mixture is warmed under reflux for 2 hours. The reaction solution is cooled to room temperature. 50 ml of water are added to the batch. The phases are separated. The aqueous phase is extracted with toluene. The combined organic phases are washed with water, dried over MgSO₄, filtered, and the solvent is stripped off in vacuo.

The solid obtained is recrystallised from isopropanol.

$^1$H NMR (CDCl$_3$, δ (ppm), J (Hz)): 1.04 (t, 6H, J=7.2 Hz), 1.32 (m, 20H), 3.51 (t, 4H, J=7.5 Hz), 7.23 (s, 1H), 7.29 (dt, 2H, J=7.3 Hz, J=2.8 Hz), 7.34 (t, 2H, J=8 Hz), 7.37 (d, 4H, J=7.55), 7.47 (d, 4H, J=7.55), 8.23 (d, 2H, 7.75 Hz), 7.42 (d, 4H, J=8.6), 8.82 (s, 1H).

1.2 Compound 3 (M1)

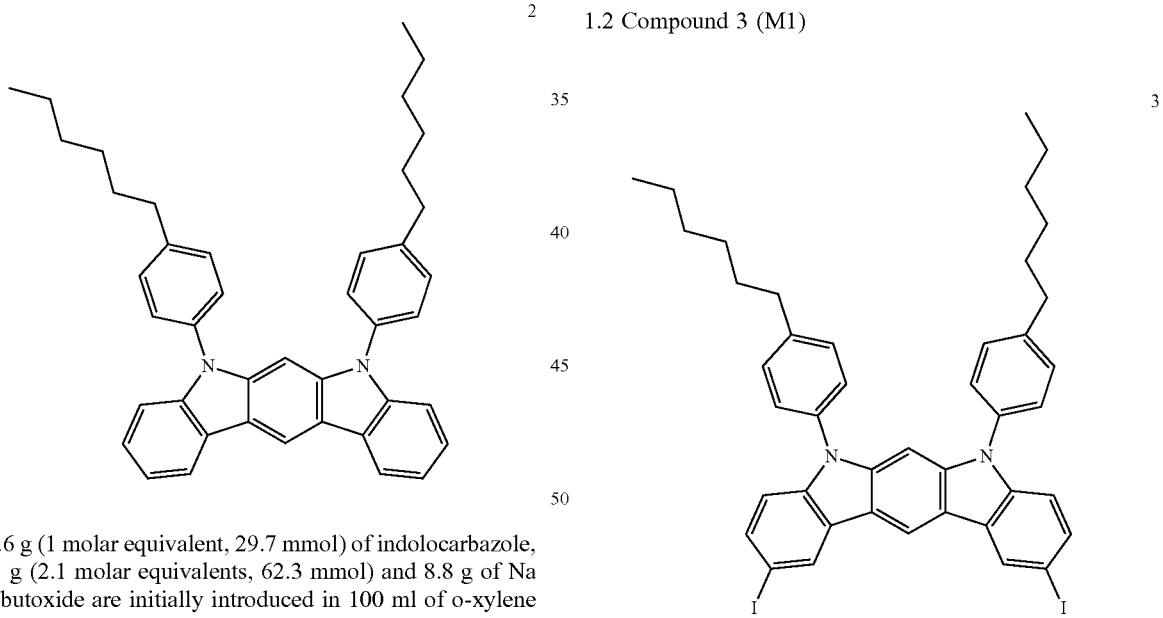

10 g (1 molar equivalent, 17.2 mmol) of compound 2 are suspended in 150 ml of glacial acetic acid. 8.6 g (2.2 molar equivalents, 37.8 mmol) of N-iodosuccinimide are added with exclusion of light. The reaction solution is stirred at room temperature for 2.5 hours. The deposited precipitate is filtered off with suction and washed with water and methanol.

The product is obtained as beige solid by recrystallisation from n-butanol.

¹H NMR (CDCl₃, δ (ppm), J (Hz)): 1.02 (t, 6H, J=7.2 Hz), 1.32 (m, 20H), 3.58 (t, 4H, J=7.5 Hz), 6.98 (s, 1H), 7.12 (d, 2H, J=7.3 Hz), 7.42 (d, 4H, J=7.55), 7.47 (d, 4H, J=7.55), 8.62 (s, 2H), 9.18 (s, 1H).

1.3 Compound 4 (M2)

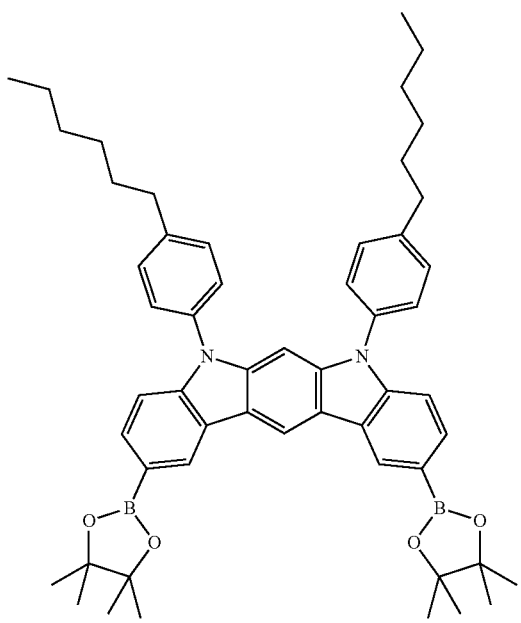

50 ml of dioxane, 4.88 g (2 molar equivalents, 19.2 mmol) of bis(pinacolato)diborane and 3.66 g (2.9 molar equivalents, 27.8 mmol) of potassium acetate are added to 8 g (1 molar equivalent, 9.6 mmol) of compound 3. 0.41 g (0.5 mmol) of 1,1-bis(diphenylphosphine)ferrocene-palladium (II) chloride (complex with dichloromethane (1:1), Pd: 13%) are subsequently added. The batch is heated to 110° C. After a TLC check, the batch is cooled to room temperature, and 50 ml of water are added. 50 ml of water is subsequently added again for phase separation. The mixture is extracted with ethyl acetate, the combined organic phases are then dried over magnesium sulfate, filtered, and the solvent is stripped off in vacuo.

The product is obtained as white solid by recrystallisation from acetonitrile.

¹H NMR (CDCl₃, δ (ppm), J (Hz)): 0.99 (t, 6H, J=7.2 Hz), 1.28 (m, 20H), 1.41 (s, 24H), 3.48 (t, 4H, J=7.5 Hz), 7.02 (s, 1H), 7.19 (d, 2H, J=7.3 Hz), 7.42 (d, 4H, J=7.55), 7.47 (d, 4H, J=7.55), 8.22 (s, 2H), 9.18 (s, 1H)

Example 2

M3

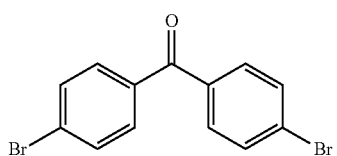

Example 3

M4

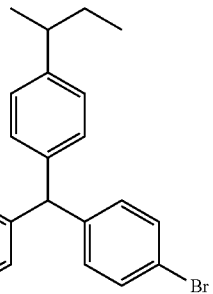

Example 4

M5

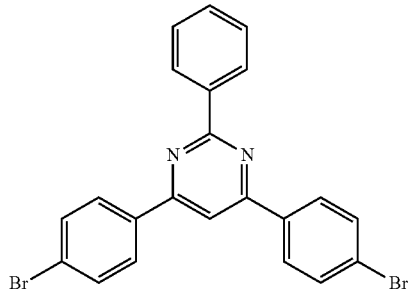

Example 5

M6

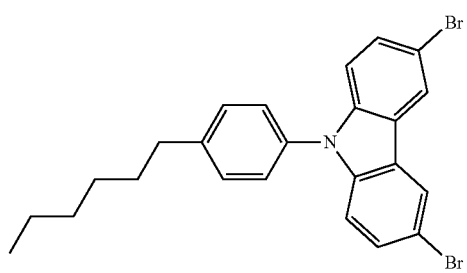

Example 6

10

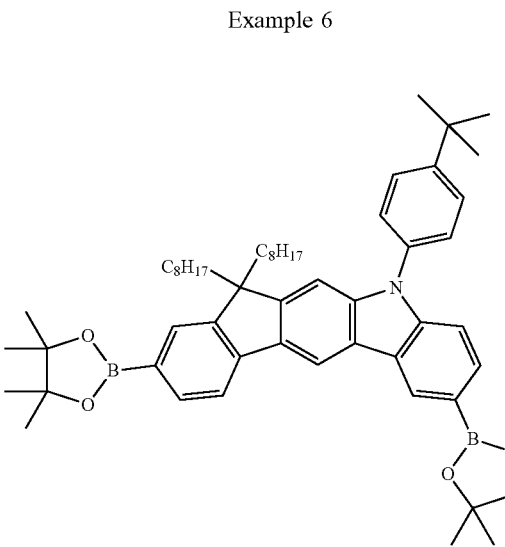

Compound 10 is prepared as follows:

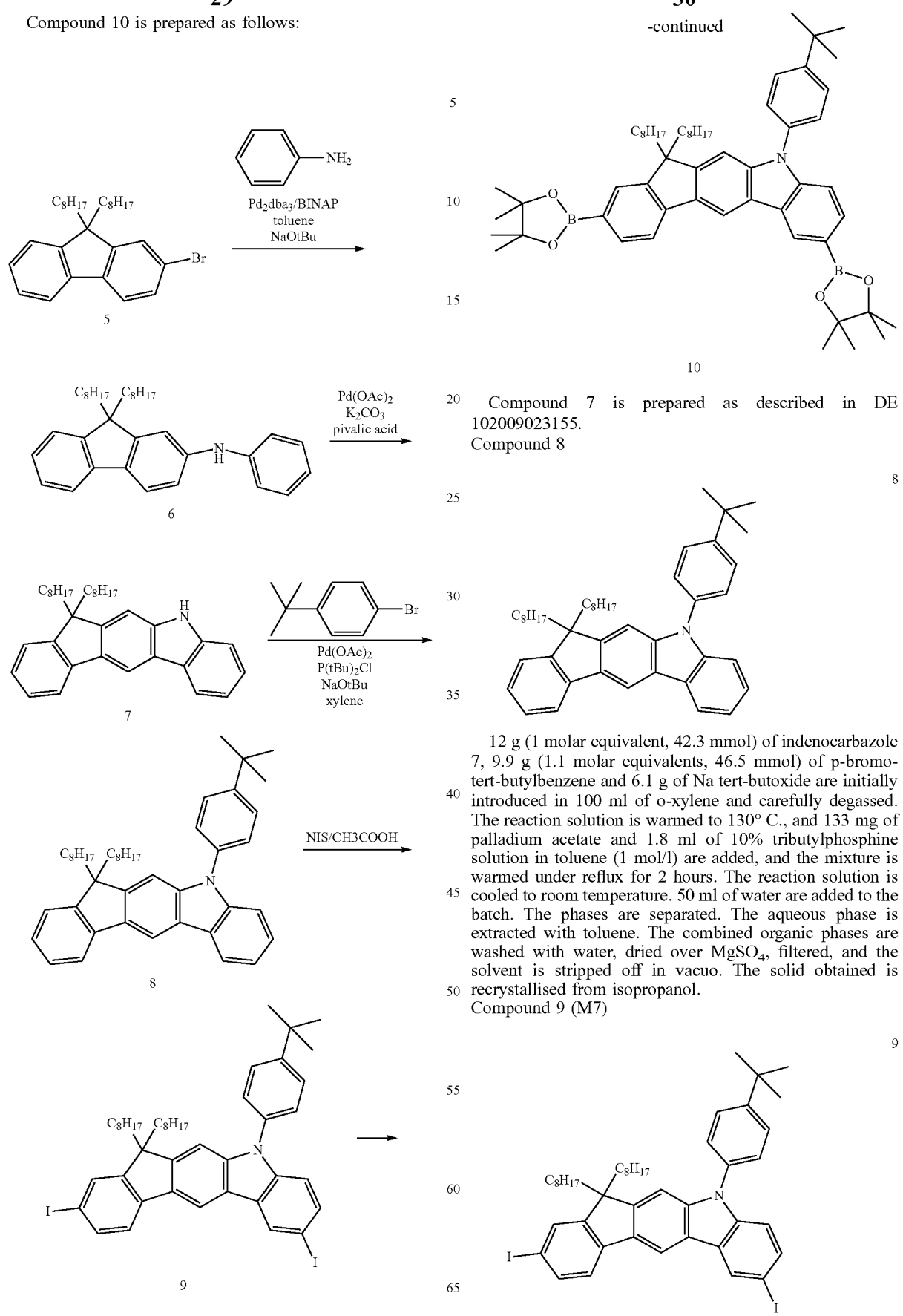

Compound 7 is prepared as described in DE 102009023155.

Compound 8

12 g (1 molar equivalent, 42.3 mmol) of indenocarbazole 7, 9.9 g (1.1 molar equivalents, 46.5 mmol) of p-bromo-tert-butylbenzene and 6.1 g of Na tert-butoxide are initially introduced in 100 ml of o-xylene and carefully degassed. The reaction solution is warmed to 130° C., and 133 mg of palladium acetate and 1.8 ml of 10% tributylphosphine solution in toluene (1 mol/l) are added, and the mixture is warmed under reflux for 2 hours. The reaction solution is cooled to room temperature. 50 ml of water are added to the batch. The phases are separated. The aqueous phase is extracted with toluene. The combined organic phases are washed with water, dried over MgSO$_4$, filtered, and the solvent is stripped off in vacuo. The solid obtained is recrystallised from isopropanol.

Compound 9 (M7)

8 g (1 molar equivalent, 19 mmol) of compound 8 are suspended in 150 ml of glacial acetic acid. 5.3 g (2.2 molar equivalents, 41.8 mmol) of N-iodosuccinimide are added with exclusion of light. The reaction solution is stirred at room temperature for 2.5 hours. The deposited precipitate is filtered off with suction and washed with water and methanol. The product is obtained as beige solid by recrystallisation from n-butanol.

Compound 10 (M8)

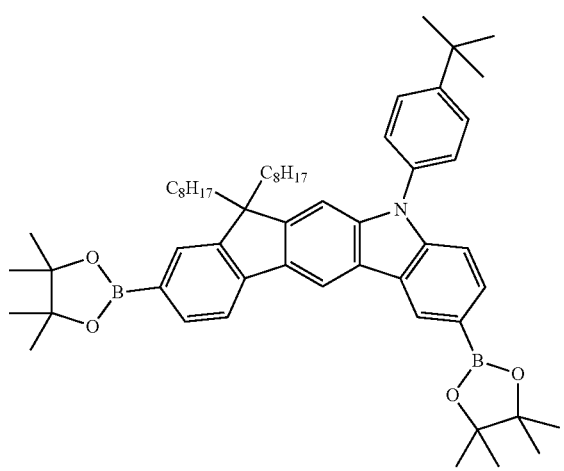

50 ml of dioxane, 4.7 g (2 molar equivalents, 18.4 mmol) of bis(pinacolato)diborane and 3.51 g (2.9 molar equivalents, 26.7 mmol) of potassium acetate are added to 8 g (1 molar equivalent, 9.2 mmol) of compound 9. 0.41 g (0.5 mmol) of 1,1-bis(diphenylphosphine)ferrocene-palladium (II) chloride (complex with dichloromethane (1:1), Pd: 13%) are subsequently added. The batch is heated to 110° C. After a TLC check, the batch is cooled to room temperature, and 50 ml of water are added. 50 ml of water is subsequently again added for phase separation. The mixture is extracted with ethyl acetate, the combined organic phases are then dried over magnesium sulfate, filtered, and the solvent is stripped off in vacuo.

Example 7: (Comparative Backbone Monomer M9)

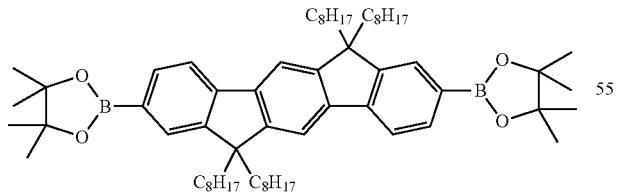

Examples 8 to 17: Preparation of the Polymers

Copolymers P1 to P8 according to the invention and comparative polymers V1 and V2 are synthesised by SUZUKI coupling in accordance with WO 03/048225 A2 using the following monomers (percent data=mol %).

Example 8: (Polymer P1)

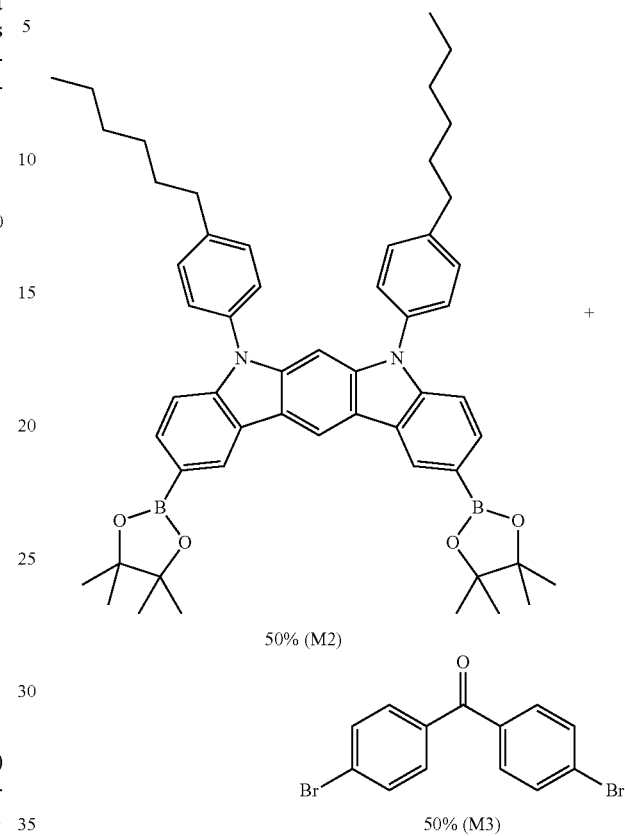

Example 9: (Polymer P2)

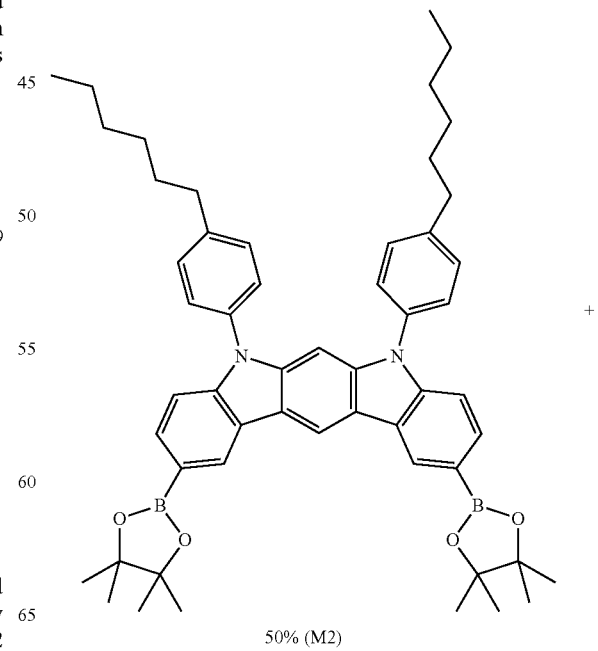

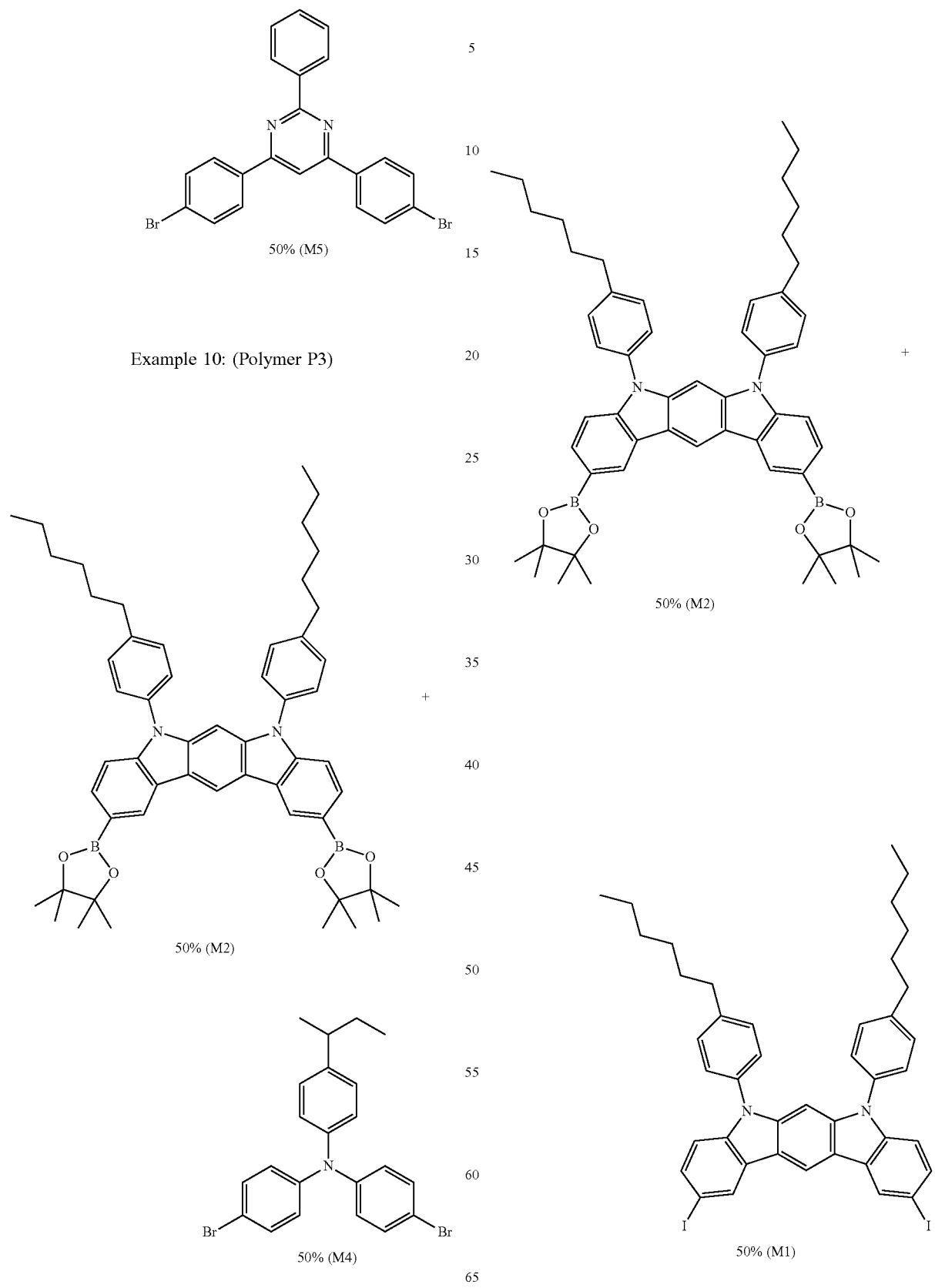

Example 12: (Polymer P5)
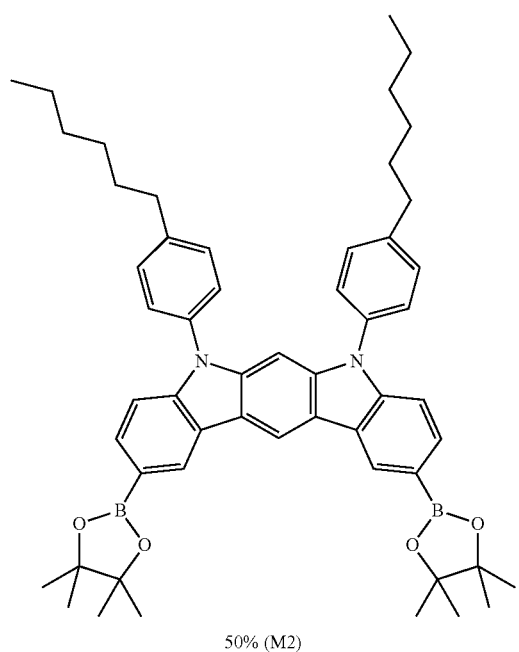
50% (M2)
+
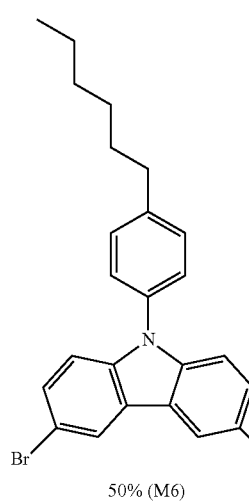
50% (M6)
Example 13: (Polymer P6)
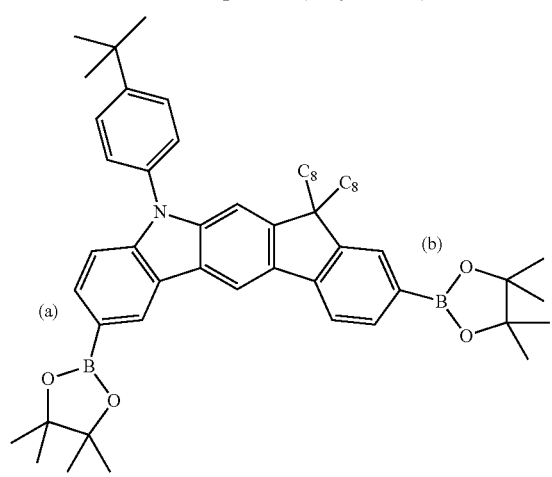
50% (M8)
-continued
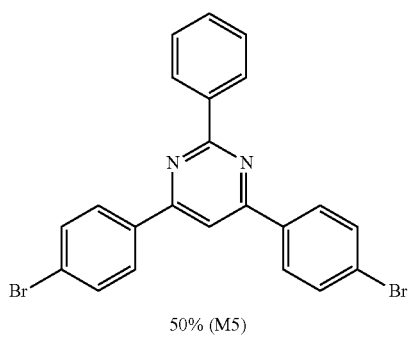
50% (M5)
Example 14: (Polymer P7)
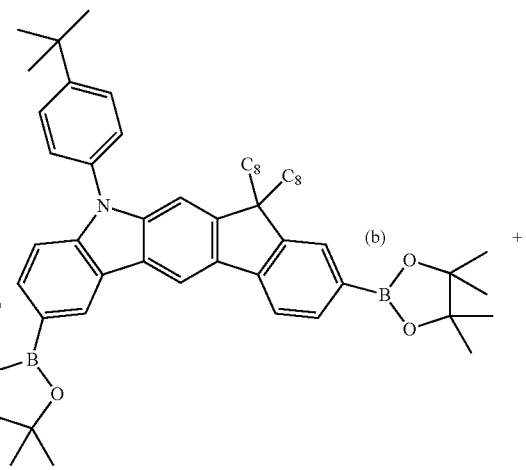
50% (M8)
+
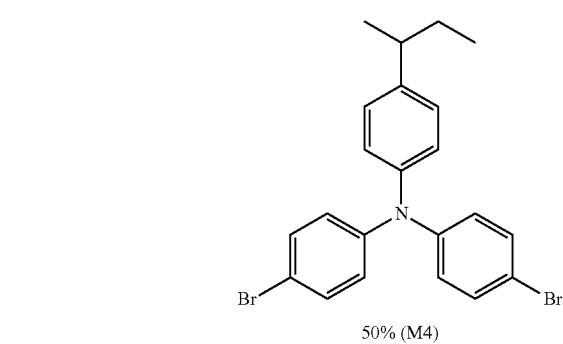
50% (M4)

Example 15: (Polymer P8)

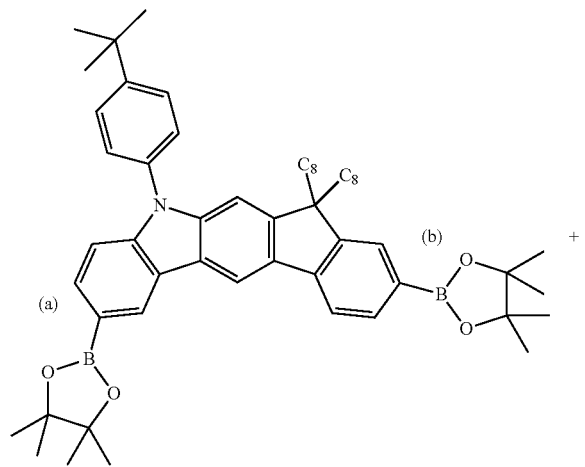

50% (M8)

Example 16: (Comparative Polymer V1—Interlayer)

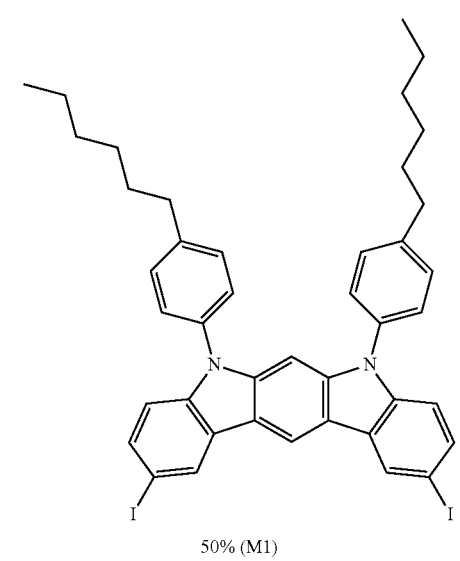

50% (M1)

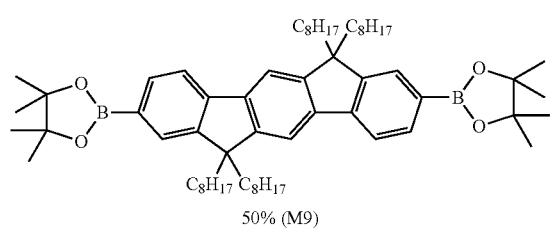

50% (M9)

+

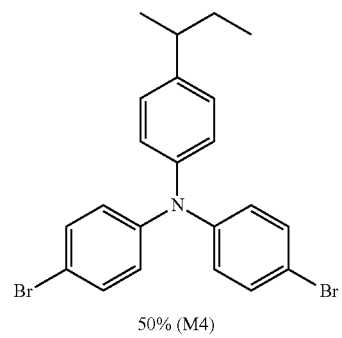

50% (M4)

Example 17: (Comparative Polymer V2—Matrix)

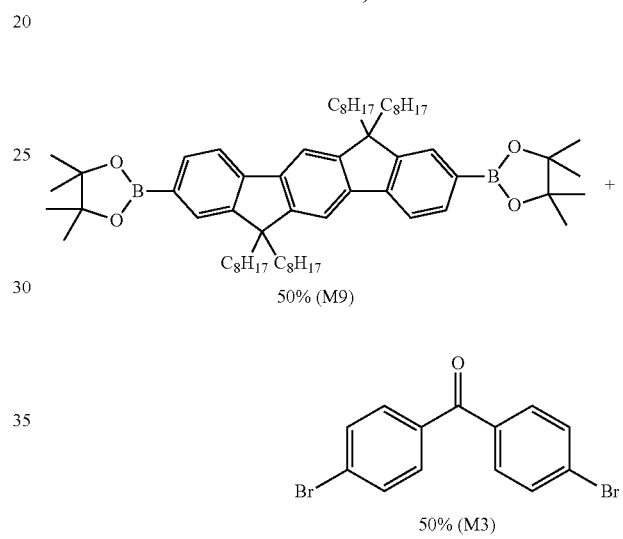

50% (M9)

+

50% (M3)

Further materials used:

Structure of triplet emitter TEG1, which is used as emitter in the emission layer (EML). Photoluminescence spectrum of TEG1 in toluene was recorded and exhibits a minimum at 491.65 nm (2.52 eV) and a maximum at 512.4 nm (2.42 eV).

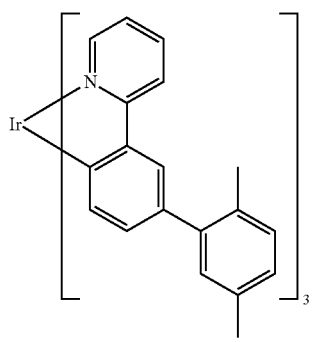

TEG1

Structure of the soluble SM matrix material TMM1 which serves as reference matrix material.

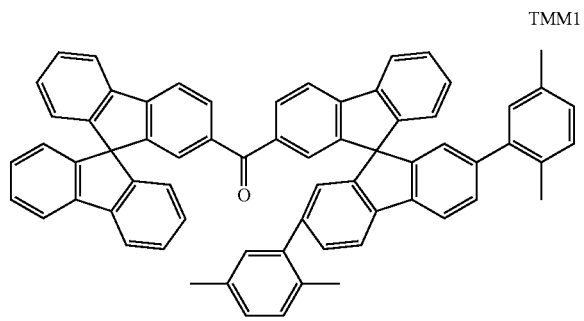 [SMILES: Cc1ccc(C)c(-c2ccc3c(c2)C2(c4ccccc4-c4ccc(C(=O)c5ccc6c(c5)C5(c7ccccc7-c7ccccc75)c5ccccc5-6)cc42)c2cc(-c4cc(C)ccc4C)ccc2-3)c1]

TMM1

Example 18: (Quantum-Chemical Simulation of the Energy Levels of the Materials Used)

In order to develop a suitable material for use in OLEDs, predictions of the energy levels, in particular the HOMO and LUMO levels of excited triplet states of the various materials are essential.

The quantum-chemical simulation of the energy levels can be carried out by means of the Gaussian 03W software (Gaussian Inc.). Firstly, the molecular geometry is optimised via an AM1 method. An energy calculation is subsequently preferably carried out by the TD-DFT (time-dependent density function theory) method with the B3PW9 correction function and the 6-31G(d) base set, where this method includes calculation of the HOMO/LUMO levels and the energy levels for the triplet and singlet state. The respective first singlet and triplet states, which are referred to below as S1 and T1 levels, are the most important here.

The HOMO and LUMO levels are corrected as follows using cyclic voltammetry: a material set is measured by means of CV and calculated using, for example, the above-mentioned method with Gaussian 03W. The calculated values are then calibrated with reference to the measured values. The calibration factor is then used for further calculations. For simplification, trimers of the polymers are calculated. For example, M2-M3-M2 denotes a structure building block as follows, where the polymerisable groups have been removed:

Detailed Description of the Quantum-Chemical Calculation:

The HOMO and LUMO positions and the triplet/singlet level of the organic functional materials are determined via quantum-chemical calculations. To this end, the "Gaussian03W" program package (Gaussian Inc.) is used. In order to calculate organic substances without metals, firstly a geometry optimisation is carried out using a "Ground State/Semi-empirical/Default spin/AM1" semi-empirical method (charge 0/spin singlet). This is followed by an energy calculation on the basis of the optimised geometry. The "TD-SCF/DFT/Default Spin/B3PW91" method with the "6-31G(d)" base set is used here (charge 0/spin singlet). For organometallic compounds, the geometry calculation is optimised via the "Ground State/Hartree-Fock/Default Spin/LanL2MB" method (charge 0/spin singlet). The energy calculation is carried out analogously to the organic substances as described above, with the difference that the "LanL2DZ" base set (pseudo=LanL2) is used for the metal atom and the "6-31G(d)" base set is used for the ligands. The most important results are HOMO/LUMO levels and energies for the triplet and singlet excited states. The first singlet and excited singlet/triplet states are the most important and are known as S1 and T1 levels. The energy calculation gives the HOMO HEh or LUMO LEh in hartree units. The HOMO and LUMO values in electron-volts are determined therefrom as follows, where these relationships arise from the calibration with reference to cyclic voltammetry measurements:

HOMO (eV)=(($HEh$*27.212)−0.9899)/1.1206

LUMO (eV)=(($LEh$*27.212)−2.0041)/1.385

These values are to be regarded in the sense of the present application as energetic position of the HOMO level or LUMO level of the materials. As example, an HOMO of −0.20435 hartrees and an LUMO of −0.06350 hartrees are obtained for compound TMM1 (see also Table 1) from the calculation, which corresponds to a calibrated HOMO of −5.85 eV and a calibrated LUMO of −2.70 eV.

The T1 level is corrected by measurement as follows: for organic compounds which contain no metal, in general, for example, triplet matrix materials, hole-transport materials

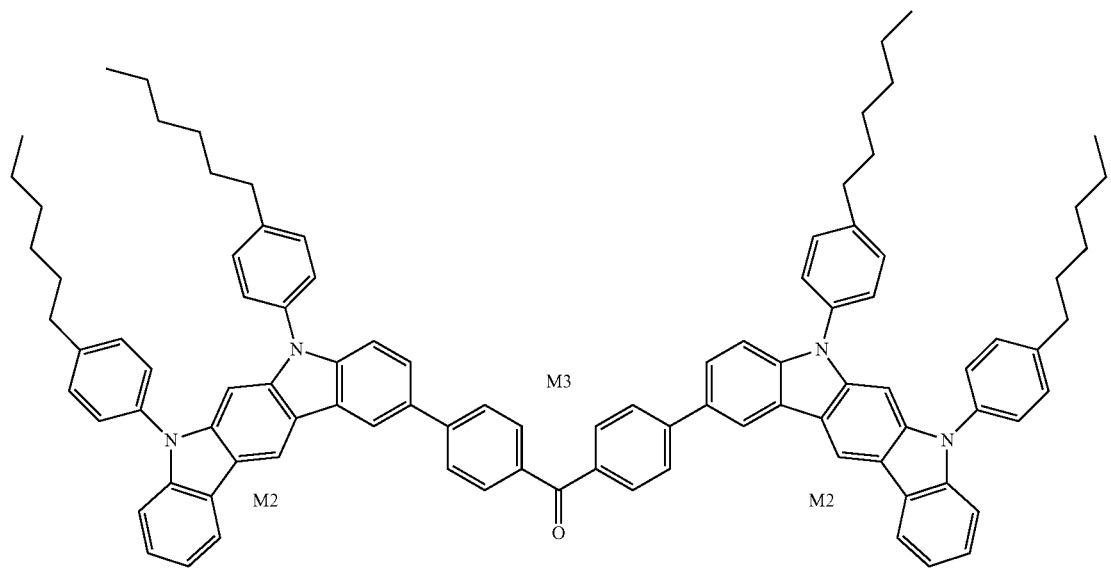

and electron-transport materials, the T1 level is measured by time-resolved spectroscopy at low temperatures as follows: 100 nm organic films are coated onto quartz and then excited by a YAG laser (@ 355 nm) or an $N_2$ laser (@ 337 nm) at helium temperature (10K). The delayed photoluminescence after 10 μs is recorded. The T1 level is determined from the beginning of the delayed photoluminescence. For emissive metal complexes, the T1 level is determined simply by employing the photoluminescence at room temperature.

For polymers, in particular conjugated polymers, a trimer of the polymer is calculated. For example for a polymer which is polymerised from monomer M1 and M2, trimers M2-M3-M2 and/or M3-M2-M3 have been used in the calculation, where the polymerisable groups are removed and relatively long alkyl chains have been reduced to a methyl chain. For agreement between the CV measurements and the simulations of polymers, reference can be made to the disclosure in WO 2008/011953 A1.

accordance with the present invention all have much higher T1 levels and LUMO levels than V1.

TABLE 1

Summary of the energy levels of P1 to P8, V1 and V2 and TMM1

| Material | Simulated unit | Homo corr. [eV] | Lumo corr. [eV] | Triplet T1 [eV] | Singlet S1 [eV] |
|---|---|---|---|---|---|
| P1 | M2-M3-M2 | −5.52 | −2.68 | 2.64 | 2.81 |
| P2 | M2-M5-M2 | −5.48 | −2.59 | 2.74 | 2.90 |
| P3 | M2-M4-M2 | −5.00 | −2.14 | 2.63 | 2.85 |
| P4 | M1-M2-M1 | −5.20 | −2.12 | 2.72 | 2.96 |
| P5 | M2-M6-M2 | −5.23 | −2.12 | 2.76 | 3.00 |
| P6 | bM8a-M5-aM8b | −5.57 | −2.62 | 2.77 | 2.91 |
| P6 | aM8b-M5-aM8b | −5.55 | −2.66 | 2.59 | 3.05 |
| P6 | aM8b-M5-bM8a | −5.54 | −2.69 | 2.59 | 3.12 |
| P7 | bM8a-M4-aM8b | −5.05 | −2.12 | 2.64 | 2.85 |

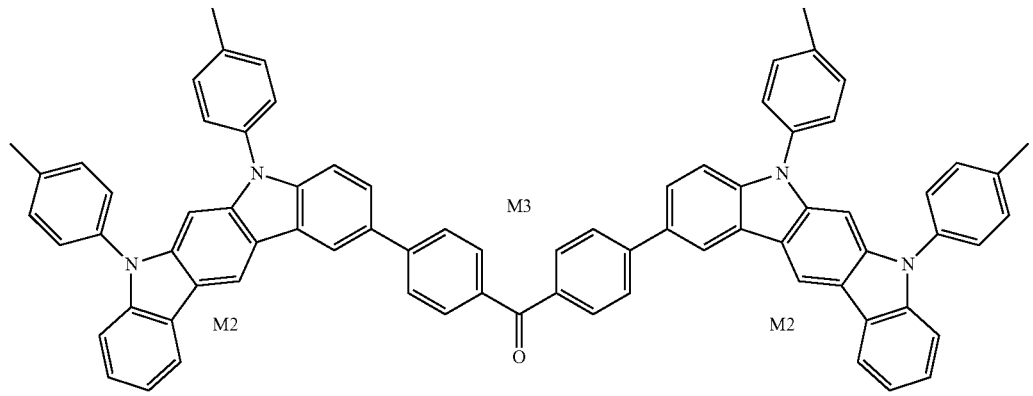

For P6 to P8, there are three different configurations of trimers, since monomer M8 has two non-equivalent polymerisable ends, which are labelled "a" and "b". For P6, configurations "aM8b-M5-bM8a", "bM8a-M5-bM8a" and "aM8b-M5-aM8b", for example, exist. For simplicity, only trimer M1-M8-M1 is calculated for P8.

The simulated energy levels are summarised in Table 1. P1, P2, P4, P5, P6 and P8 are used as polymer matrix or co-matrix for triplet emitter TEG1. TMM1 is a reference material for the matrix, which functions well with TEG1. If the novel matrix has materials having the same or a higher T1 level than TMM1, the novel matrix materials should also function with TEG1. This is the case, for example, for polymers P1, P2, P4, P5, P6 and P8. According to the PL spectrum of TEG1, the minimum requirement of the matrix material for TEG1 is a T1 level which is higher than 2.42 eV, preferably higher than 2.52 eV. Polymer V2 is a further reference polymer matrix, which has a very low T1 level of 2.42 eV.

P3, P4, P5, P7 and P8 are employed as interlayer in comparison with a standard interlayer in polymer V1. The interlayer should have a hole-transport and electron-blocking function. Thus, the novel interlayer polymer should have a similar HOMO level, but a higher LUMO level than V1 in order to have a better electron-blocking action. Furthermore, it is also very desirable for the interlayer to have an exciton-blocking function, for example a high T1 level in the case of the triplet EML, in order to prevent diffusion of excitons from the EML to the anode. The polymers in TABLE 1-continued Summary of the energy levels of P1 to P8, V1 and V2 and TMM1

| Material | Simulated unit | Homo corr. [eV] | Lumo corr. [eV] | Triplet T1 [eV] | Singlet S1 [eV] |
|---|---|---|---|---|---|
| P7 | aM8b-M4-aM8b | −5.06 | −2.24 | 2.51 | 2.94 |
| P7 | aM8b-M4-bM8a | −5.08 | −2.29 | 2.48 | 3.06 |
| P8 | M1-M8-M1 | −5.24 | −2.17 | 2.63 | 2.96 |
| V1 | M9-M4-M9 | −5.14 | −2.47 | 2.37 | 2.90 |
| V2 | M9-M3-M9 | −5.75 | −2.85 | 2.42 | 3.12 |
| TMM1 | TMM1 | −5.85 | −2.70 | 2.65 | 3.35 |

Example 19: Production of a Device (OLED)

OLED1 to OLED4 having a structure in accordance with the prior art, ITO/PEDOT/interlayer/EML/cathode, are produced in accordance with the following procedure using the corresponding solutions as summarised in Table 2:

1) PEDOT (Baytron P AI 4083) is deposited as buffer layer having a thickness of 80 nm on an ITO-coated glass substrate by spin coating and then heated at 180° C. for 10 minutes;

2) a 20 nm interlayer (IL) is deposited thereon by means of spin coating from a toluene solution having a concentration of 0.5% by weight in a glove box;

3) the interlayer is heated at 180° C. for 1 hour in a glove box;

4) an emission layer (EML) is deposited by spin coating from solution in toluene having a suitable concentration in order to produce a layer having a thickness of 80 nm;
5) the device obtained is heated in a glove box in order to remove solvent residues;
6) a Ba/Al cathode is deposited by vapour deposition on the emission layer having a thickness of 3 nm/150 nm;
7) the device is encapsulated.

The OLEDs produced in this way are listed in Table 2. Of them, OLED 1 to OLED 6 is, in order to check the uses of P1, P2, P4, P5, P6 and P8 as matrix polymer for green triplet emitters, with V1 as interlayer and Ref1 and Ref2 as reference; in OLED7-11, P3, P4, P5, P7 and P8 are tested, as interlayer with the same standard EML and Ref1 as reference.

TABLE 2

Summary of the OLED devices

| | | EML | |
|---|---|---|---|
| | Interlayer | Material | Conc. in toluene |
| Ref. 1 | V1 | 80% TMM1:20% TEG1 | 25 mg/ml |
| Ref. 2 | V1 | 80% V2:20% TEG1 | 10 mg/ml |
| OLED 1 | V1 | 80% P1:20% TEG1 | 10 mg/ml |
| OLED 2 | V1 | 80% P2:20% TEG1 | 10 mg/ml |
| OLED 3 | V1 | 20% P4:60% TMM1:20% TEG1 | 15 mg/ml |
| OLED 4 | V1 | 20% P5:60% TMM1:20% TEG1 | 15 mg/ml |
| OLED 5 | V1 | 80% P6:20% TEG1 | 10 mg/ml |
| OLED 6 | V1 | 20% P8:60% TMM1:20% TEG1 | 15 mg/ml |
| OLED 7 | P3 | 80% TMM1:20% TEG1 | 25 mg/ml |
| OLED 8 | P4 | 80% TMM1:20% TEG1 | 25 mg/ml |
| OLED 9 | P5 | 80% TMM1:20% TEG1 | 25 mg/ml |
| OLED 10 | P7 | 80% TMM1:20% TEG1 | 25 mg/ml |
| OLED 11 | P8 | 80% TMM1:20% TEG1 | 25 mg/ml |

Example 20: Results of the Polymers on Use as Triplet Matrix

The OLEDs obtained in this way, OLED 1 to OLED 6, Ref. 1 and Ref. 2, are characterised by standard methods. The following properties are measured here: VIL characteristics, electroluminescence spectrum, colour coordinates, efficiency, operating voltage and lifetime.

Comparison with Ref. 1 and Ref. 2 as reference is summarised in Table 3, where $U_{on}$ stands for the use voltage, U(100) stands for the voltage at 100 cd/m$^2$ and U(1000) stands for the voltage at 1000 cd/m$^2$. The external quantum efficiency is abbreviated to EQE. Lifetime is measured in DC mode. LT DC is defined as the time by which the luminous density of the OLED drops by 50% of the original luminous density at constant current.

TABLE 3

Performance comparison of OLED 1 to OLED 6 and Ref. 1 and Ref. 2

| | Max. eff. [cd/A] | Uon [V] | U(100) [V] | CIE @ 1000 cd/m$^2$ | EQE @ max. eff. | LT DC [hrs @ nits] | |
|---|---|---|---|---|---|---|---|
| Ref. 1 | 22.0 | 2.8 | 4.4 | 0.34/0.62 | 6.2% | 95 | 6000 |
| Ref. 2 | 2.1 | 5.5 | 10.1 | 0.33/0.61 | 0.6% | — | — |
| OLED 1 | 27.8 | 2.9 | 4.6 | 0.34/0.62 | 7.7% | 140 | 6000 |
| OLED 2 | 29.5 | 3.0 | 4.7 | 0.33/0.62 | 8.2% | 151 | 6000 |
| OLED 3 | 32.5 | 2.9 | 4.5 | 0.34/0.62 | 9.0% | 221 | 6000 |
| OLED 4 | 31.2 | 2.8 | 4.3 | 0.33/0.63 | 8.4% | 212 | 6000 |
| OLED 5 | 30.5 | 3.0 | 4.5 | 0.33/0.62 | 8.5% | 183 | 6000 |
| OLED 6 | 33.2 | 2.9 | 4.4 | 0.33/0.63 | 8.9% | 231 | 6000 |

All OLEDs exhibit a similar colour at 1000 cd/m$^2$.

Ref. 2 gives a very low efficiency, which is attributable to the quenching effect owing to the low T1 level. In other words, most of the triplet excitons on TEG1 have been transferred into the non-emitting matrix V2. A lifetime test is not possible for Ref. 2.

OLED 1, OLED 2 and OLED 5, in which P1, P2 and P6 are used as single-component polymer matrix, give a better efficiency and longer lifetime compared with Ref. 1.

A further improvement is achieved in OLED 3, OLED 4 and OLED 6, where bipolar matrices are used. In particular, the lifetime can be increased considerably. P4, P5 and P8 are said to be good hole-transport materials and are intended to be used in combination with other electron-transport matrix materials in the EML. A further optimisation can be expected, for example using an additional hole-blocking layer on the upper side of the EML and an optimisation of the composition of the EML.

A further advantage of the polymer matrices in accordance with the present invention compared with the SM matrix material lies in the fact that the polymer matrix can be processed more easily from a solution and also has a better film-formation property after application to the substrate, for example by ink-jet printing.

Example 21: Results of the Polymers on Use as Interlayer

The OLEDs obtained in this way, OLED 7 to OLED 11 and Ref. 1, are characterised by standard methods. The following properties are measured here: VIL characteristics, electroluminescence spectrum, colour coordinates, efficiency, operating voltage and lifetime.

Comparison with Ref. 1 as reference is summarised in Table 4. Compared with Ref. 1, OLED 7 to OLED 11, in which the novel interlayer polymers in accordance with the present invention are used, exhibit excellent performance with respect to efficiency and lifetime. An improvement of this type can be attributed to the better electron blocking and/or better exciton blocking through the use of the novel interlayer polymers. Of them, OLED 7 and OLED 11, which use P3 and P8 as interlayer polymer, give the longest lifetime.

TABLE 4

Comparison of the performance of OLED 7 to OLED 11 and Ref. 1

| | Max. eff. [cd/A] | Uon [V] | U(100) [V] | CIE @ 1000 cd/m$^2$ | EQE @ max. eff. | LT DC [hrs @ nits] | |
|---|---|---|---|---|---|---|---|
| Ref. 1 | 22.0 | 2.8 | 4.4 | 0.34/0.62 | 6.2% | 95 | 6000 |
| OLED 7 | 29.5 | 3.0 | 4.2 | 0.34/0.62 | 8.2% | 281 | 6000 |
| OLED 8 | 34.6 | 2.8 | 4.1 | 0.33/0.63 | 9.5% | 250 | 6000 |
| OLED 9 | 23.0 | 2.8 | 4.5 | 0.33/0.63 | 6.2% | 111 | 6000 |
| OLED 10 | 36.6 | 2.7 | 4.0 | 0.34/0.63 | 10.3% | 273 | 6000 |
| OLED 11 | 35.2 | 2.7 | 4.1 | 0.33/0.63 | 9.7% | 291 | 6000 |

The invention claimed is:
1. A copolymer containing one or more structural units of the general formula (2), (3), and/or (5)

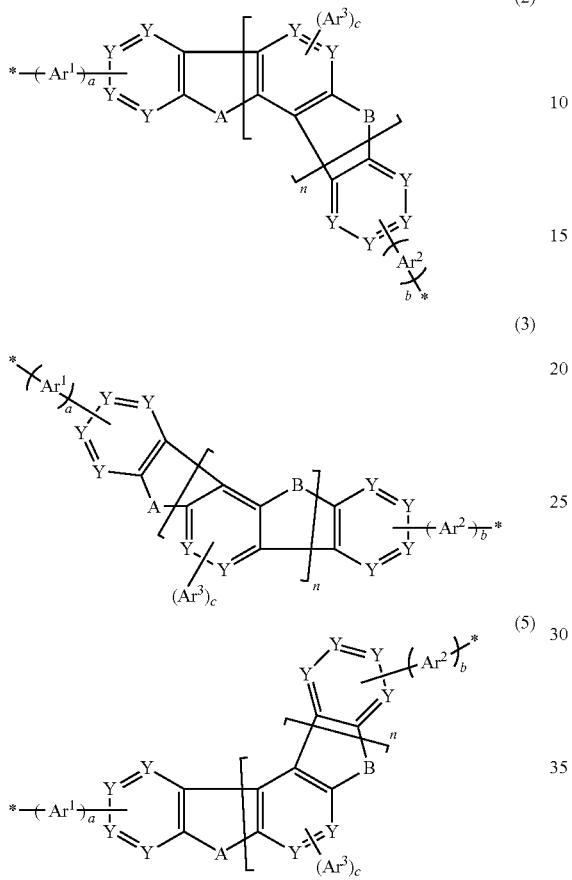

where the following applies to the symbols and indices:

A and B are selected, identically or differently on each occurrence, from the group consisting of —C(R$^1$)$_2$, —Si(R$^1$)$_2$, —NR$^1$, —O, —S, —S(=O), —SO$_2$, —CF$_2$, —SF$_4$, —P, —P(=O)R$^1$, —PF$_2$, —P(=S)R$^1$, —As, —As(=O), —As(=S), —Sb, —Sb(=O) and —Sb(=S), with the proviso that A and B are not simultaneously either —C(R$^1$)$_2$ or —NR$^1$;

Y is C if a group Ar$^1$, Ar$^2$ or Ar$^3$ is bonded to the group Y or is, identically or differently on each occurrence, CR$^1$ or N;

R$^1$ is, identically or differently on each occurrence, —H, —X, —CN, —NC, —NCO, —NCS, —OCN, —SCN, —C(=O)N(R$^2$)$_2$, —C(=O)X, —C(=O)R$^1$, —NH$_2$, —N(R$^2$)$_2$, —SH, —SR$^2$, —SO$_3$H, —SO$_2$R$^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic group having 5 to 40 ring atoms, which may in each case be substituted by one or more radicals R$^2$, or an aromatic or heteroaromatic ring system having 5 to 40 aromatic ring atoms, which may in each case be substituted by one or more radicals R$^2$, or an aryloxy or heteroaryloxy group having 5 to 40 aromatic ring atoms, which is optionally substituted by one or more radicals R$^2$, or a combination of these systems; two or more substituents R$^1$ here may also form a mono- or polycyclic, aliphatic, aromatic or heteroaromatic ring system with one another, together with the atoms to which they are bonded, where two groups R$^1$ may also form a spiro group together with the fluorene unit to which they are bonded;

X is halogen;

R$^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

Ar$^1$, Ar$^2$ and Ar$^3$ are on each occurrence, identically or differently, an aromatic or heteroaromatic ring system having 5 to 40 ring atoms, which is optionally substituted by one or more radicals R', where the ring system may also be condensed onto positions 7,8 or 8,9 of the basic compound;

a, b and c are each, independently of one another, 0 or 1; and n is greater than or equal to 1;

where the copolymer contains at least one structural unit which is different from the structural unit of the formula (2), (3) and/or (5).

2. The copolymer according to claim 1, wherein the structural units of the formulae (2), (3) or (5) correspond to the structural units of the formulae (2a), (3a) or (5a)

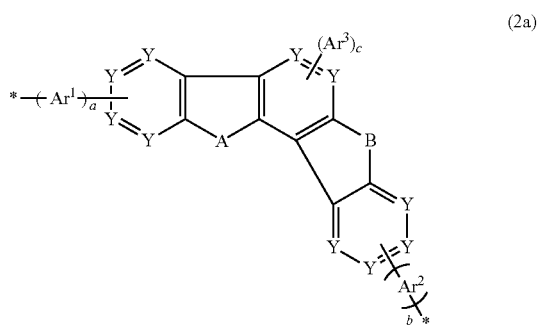

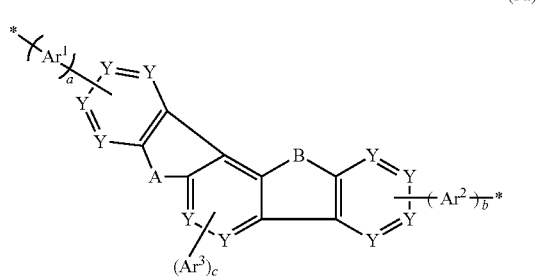

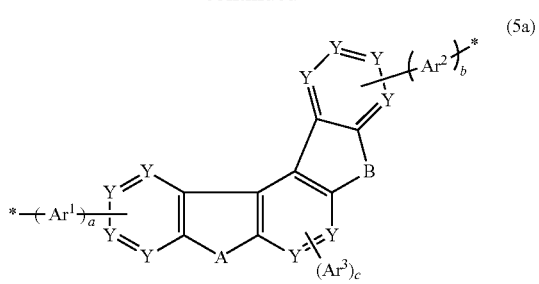
(5a)

wherein the symbols and indices have the meanings indicated in claim 1.

3. The copolymer according to claim 1, wherein the structural units of the formulae (2), (3) or (5) correspond to the structural units of the formulae (2b), (3b) or (5b)

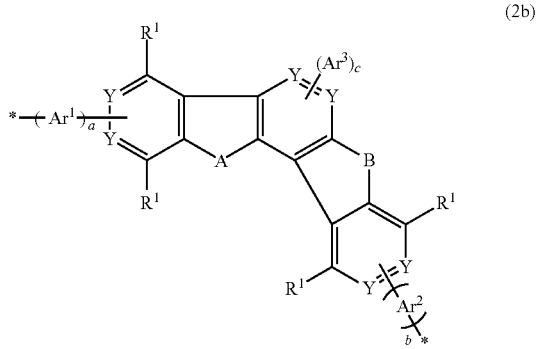
(2b)

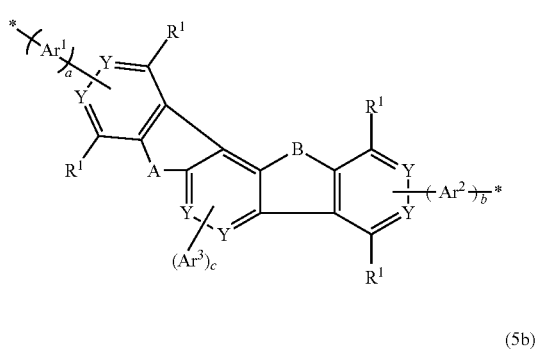
(3b)

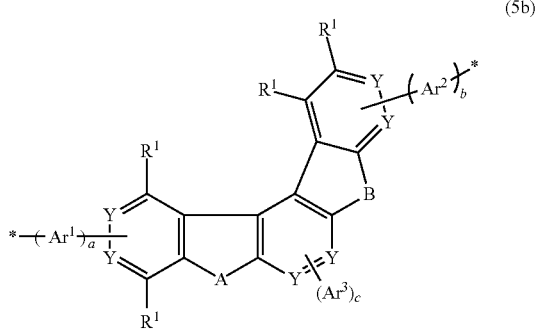
(5b)

wherein the symbols and indices have the meanings indicated in claim 1.

4. The copolymer according to claim 1, wherein the structural units of the formulae (2), (3) or (5) correspond to the structural units of the formulae (2c), (3c) or (5c)

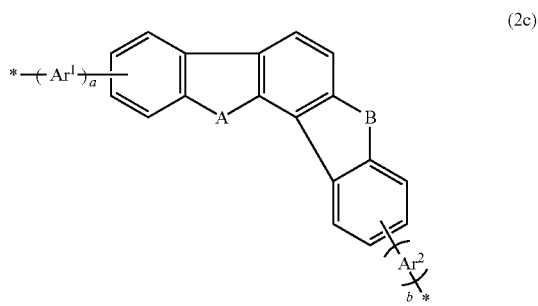
(2c)

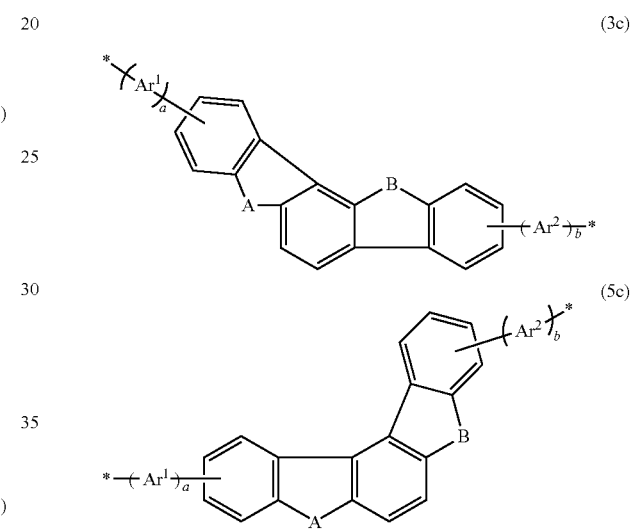
(3c)

(5c)

wherein the symbols and indices have the meanings indicated in claim 1.

5. The copolymer according to claim 1, wherein A and B are selected, identically or differently on each occurrence, from $C(R^1)_2$, $NR^1$, O, S or C(=O).

6. The copolymer according to claim 1, wherein the at least one further structural unit is an emitter unit.

7. The copolymer according to claim 1, wherein the at least one further structural unit is a triplet emitter unit.

8. A process for the preparation of the copolymer according to claim 1, which comprises preparing the copolymer by SUZUKI, YAMAMOTO, STILLE or HARTWIG-BUCHWALD polymerization.

9. A mixture of a copolymer according to claim 1 with further polymeric, oligomeric, dendritic and/or a low-molecular-weight substance.

10. The mixture according to claim 9, wherein the low-molecular-weight substance is a triplet emitter.

11. A solution which comprises the copolymer according to claim 1 in one or more solvents.

12. An organic electroluminescent device which comprises a copolymer containing one or more structural units of the general formula (2), (3) and/or (5)

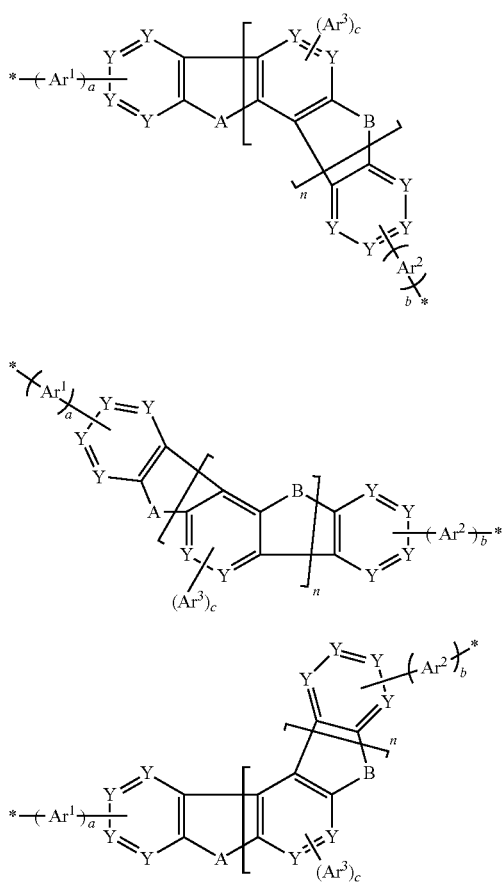

where the following applies to the symbols and indices:

A and B are selected, identically or differently on each occurrence, from the group consisting of —C(R$^1$)$_2$, —Si(R$^1$)$_2$, —NR$^1$, —O, —S, —C(=O), —S(=O), —SO$_2$, —CF$_2$, —SF$_4$, —P, —P(=O)R$^1$, —PF$_2$, —P(=S)R$^1$, —As, —As(=O), —As(=S), —Sb, —Sb(=O) and —Sb(=S), with the proviso that A and B are not simultaneously either —C(R$^1$)$_2$;

Y is C if a group Ar$^1$, Ar$^2$ or Ar$^3$ is bonded to the group Y or is, identically or differently on each occurrence, CR$^1$ or N;

R$^1$ is, identically or differently on each occurrence, —H, —X, —CN, —NC, —NCO, —NCS, —OCN, —SCN, —C(=O)N(R$^2$)$_2$, —C(=O)X, —C(=O)R$^1$, —NH$_2$, —N(R$^2$)$_2$, —SH, —SR$^2$, —SO$_3$H, —SO$_2$R$^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic group having 5 to 40 ring atoms, which may in each case be substituted by one or more radicals R$^2$, or an aromatic or heteroaromatic ring system having 5 to 40 aromatic ring atoms, which may in each case be substituted by one or more radicals R$^2$, or an aryloxy or heteroaryloxy group having 5 to 40 aromatic ring atoms, which is optionally substituted by one or more radicals R$^2$, or a combination of these systems; two or more substituents R$^1$ here may also form a mono- or polycyclic, aliphatic, aromatic or heteroaromatic ring system with one another, together with the atoms to which they are bonded, where two groups R$^1$ may also form a spiro group together with the fluorene unit to which they are bonded;

X is halogen;

R$^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

Ar$^1$, Ar$^e$ and Ar$^a$ are on each occurrence, identically or differently, an aromatic or heteroaromatic ring system having 5 to 40 ring atoms, which is optionally substituted by one or more radicals R$^1$, where the ring system may also be condensed onto positions 7,8 or 8,9 of the basic compound;

a, b and c are each, independently of one another, 0 or 1; and n is greater than or equal to 1;

where the copolymer contains at least one structural unit which is different from the structural unit of the formula (2), (3) and/or (5).

13. A triplet matrix material in an emitter layer or in the form of an interlayer which comprises the copolymer according to claim 1.

14. An organic electronic device which comprises one or more active layers, wherein at least one of said active layers comprises one or more copolymers according to claim 1.

15. An organic electronic device comprising in at least one active layer a polymer containing one or more structural units of the general formula (2), (3) and/or (5)

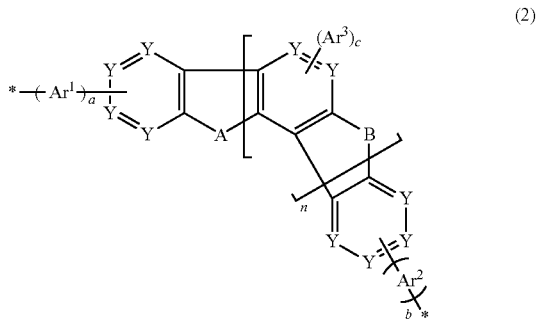

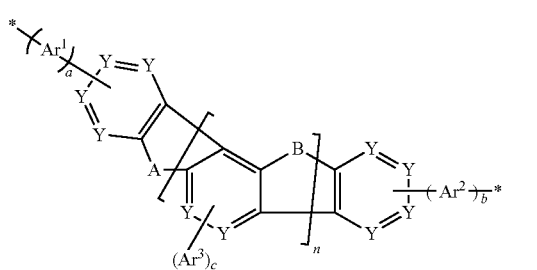

-continued

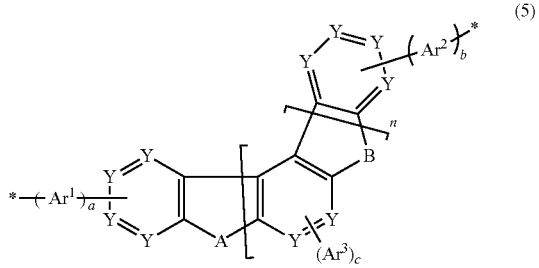
(5)

where the following applies to the symbols and indices:
A and B are selected, identically or differently on each occurrence, from the group consisting of —C(R$^1$)$_2$, —Si(R$^1$)$_2$, —NR$^1$, —O, —S, —C(=O), —S(=O), —SO$_2$, —CF$_2$, —SF$_4$, —P, —P(=O)R$^1$, —PF$_2$, —P(=S)R', —As, —As(=O), —As(=S), —Sb, —Sb(=O) and —Sb(=S), with the proviso that A and B are not simultaneously either —C(R$^1$)$_2$;

Y is C if a group Ar$^1$, Ar$^2$ or Ar$^3$ is bonded to the group Y or is, identically or differently on each occurrence, CR$^1$ or N;

R$^1$ is, identically or differently on each occurrence, —H, —X, —CN, —NC, —NCO, —NCS, —OCN, —SCN, —C(=O)N(R$^2$)$_2$, —C(=O)X, —C(=O)R$^1$, —NH$_2$, —N(R$^2$)$_2$, —SH, —SR$^2$, —SO$_3$H, —SO$_2$R$^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic group having 5 to 40 ring atoms, which may in each case be substituted by one or more radicals R$^2$, or an aromatic or heteroaromatic ring system having 5 to 40 aromatic ring atoms, which may in each case be substituted by one or more radicals R$^2$, or an aryloxy or heteroaryloxy group having 5 to 40 aromatic ring atoms, which is optionally substituted by one or more radicals R$^2$, or a combination of these systems; two or more substituents R$^1$ here may also form a mono- or polycyclic, aliphatic, aromatic or heteroaromatic ring system with one another, together with the atoms to which they are bonded, where two groups R$^1$ may also form a spiro group together with the fluorene unit to which they are bonded;

X is halogen;

R$^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

Ar$^1$, Ar$^2$ and Ar$^3$ are on each occurrence, identically or differently, an aromatic or heteroaromatic ring system having 5 to 40 ring atoms, which is optionally substituted by one or more radicals R$^1$, where the ring system may also be condensed onto positions 7,8 or 8,9 of the basic compound;

a, b and c are each, independently of one another, 0 or 1; and n is greater than or equal to 1.

16. The organic electronic device according to claim 15, wherein A and B are selected, identically or differently on each occurrence, from C(R$^1$)$_2$, NR$^1$, O, S or C(=O).

17. The organic electronic device according to claim 14, wherein the device is an organic or polymeric organic electroluminescent device.

18. The organic electronic device according to claim 14, wherein the active layer is an emitter layer or an interlayer.

19. The organic electronic device according to claim 14, wherein the device is selected from the group consisting of an organic integrated circuit, an organic field-effect transistor, an organic thin-film transistor, an organic solar cell, a dye-sensitized organic solar cell, an organic optical detector, an organic photoreceptor, an organic field-quench device, an organic laser diode and an organic plasmon emitting device.

20. A copolymer comprising one or more structural units of the general formula (1),

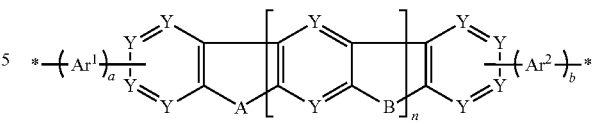
(1)

where the following applies to the symbols and indices:
A and B are selected, identically or differently on each occurrence, from the group consisting of —C(R$^1$)$_2$, —Si(R$^1$)$_2$, —NR$^1$, —O, —S, —C(=O), —S(=O), —SO$_2$, —CF$_2$, —SF$_4$, —P, —P(=O)R$^1$, —PF$_2$, —P(=S)R$^1$, —As, —As(=O), —As(=S), —Sb, —Sb(=O) and —Sb(=S), wherein only one of A or B can be —NR$^1$;

Y is C if a group Ar$^1$, Ar$^2$ or Ar$^3$ is bonded to the group Y or is, identically or differently on each occurrence, CR$^1$ or N;

R$^1$ is, identically or differently on each occurrence, —H, —X, —CN, —NC, —NCO, —NCS, —OCN, —SCN, —C(=O)N(R$^2$)$_2$, —C(=O)X, —C(=O)R', —NH$_2$, —N(R$^2$)$_2$, —SH, —SR$^2$, —SO$_3$H, —SO$_2$R$^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by D, F, Cl, Br, I, CN or NO$_2$, or an aromatic or heteroaromatic group having 5 to 40 ring atoms, which may in each case be substituted by one or more radicals R$^2$, or an aromatic or heteroaromatic ring system having 5 to 40 aromatic ring atoms, which may in each case be substituted by one or more radicals R$^2$, or an aryloxy or heteroaryloxy group having 5 to 40 aromatic ring atoms, which is optionally substituted by one or more radicals R$^2$, or a combination of these systems; two or more substituents R$^1$ here may also form a mono- or polycyclic, aliphatic, aromatic or heteroaromatic ring system with one another, together with the atoms to which they are bonded, where two groups $R^1$ may also form a spiro group together with the fluorene unit to which they are bonded;

X is halogen;

$R^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

$Ar^1$, $Ar^2$ and $Ar^3$ are on each occurrence, identically or differently, an aromatic or heteroaromatic ring system having 5 to 40 ring atoms, which is optionally substituted by one or more radicals $R^1$, where the ring system may also be condensed onto positions 7,8 or 8,9 of the basic compound;

a, b and c are each, independently of one another, 0 or 1; and n is greater than or equal to 1;

where the copolymer contains at least one structural unit which is different from the structural unit of the formula (1).

21. A mixture of a copolymer containing one or more structural units of the general formula (2), (3), and/or (5) with a low-molecular-weight substance,

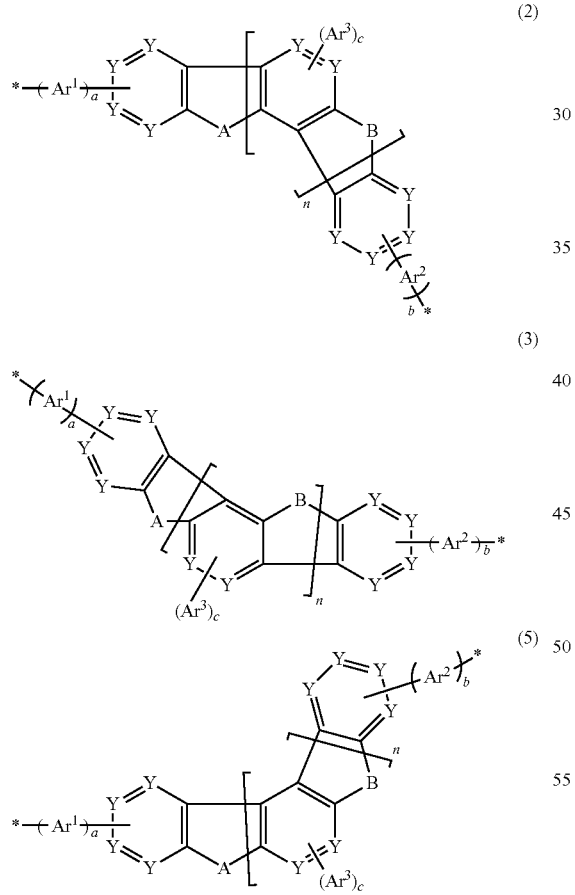

where the following applies to the symbols and indices:

A and B are selected, identically or differently on each occurrence, from the group consisting of —C($R^1$)$_2$, —Si($R^1$)$_2$, —N$R^1$, —O, —S, —C(=O), —S(=O), —SO$_2$, —CF$_2$, —SF$_4$, —P, —P(=O)$R^1$, —PF$_2$, —P(=S)$R^1$, —As, —As(=O), —As(=S), —Sb, —Sb(=O) and —Sb(=S), with the proviso that A and B are not simultaneously —N$R^1$;

Y is C if a group $Ar^1$, $Ar^2$ or $Ar^3$ is bonded to the group Y or is, identically or differently on each occurrence, $CR^1$ or N;

$R^1$ is, identically or differently on each occurrence, —H, —X, —CN, —NC, —NCO, —NCS, —OCN, —SCN, —C(=O)N($R^2$)$_2$, —C(=O)X, —C(=O)$R^1$, —NH$_2$, —N($R^2$)$_2$, —SH, —S$R^2$, —SO$_3$H, —SO$_2R^2$, —OH, —NO$_2$, —CF$_3$, —SF$_5$, substituted or unsubstituted silyl, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent CH$_2$ groups is optionally replaced by $R^2$C=C$R^2$, C≡C, Si($R^2$)$_2$, Ge($R^2$)$_2$, Sn($R^2$)$_2$, C=O, C=S, C=Se, C=N$R^2$, P(=O)($R^2$), SO, SO$_2$, N$R^2$, O, S or CON$R^2$ and where one or more H atoms is optionally replaced by D, F, Cl, Br, I, CN or NO$_2$, or an aromatic or heteroaromatic group having 5 to 40 ring atoms, which may in each case be substituted by one or more radicals $R^2$, or an aromatic or heteroaromatic ring system having 5 to 40 aromatic ring atoms, which may in each case be substituted by one or more radicals $R^2$, or an aryloxy or heteroaryloxy group having 5 to 40 aromatic ring atoms, which is optionally substituted by one or more radicals $R^2$, or a combination of these systems; two or more substituents $R^1$ here may also form a mono- or polycyclic, aliphatic, aromatic or heteroaromatic ring system with one another, together with the atoms to which they are bonded, where two groups $R^1$ may also form a spiro group together with the fluorene unit to which they are bonded;

X is halogen;

$R^2$ is on each occurrence, identically or differently, H, D or an aliphatic or aromatic hydrocarbon radical having 1 to 20 C atoms or a substituted or unsubstituted aromatic or heteroaromatic ring system having 5 to 40 ring atoms;

$Ar^1$, $Ar^2$ and $Ar^3$ are on each occurrence, identically or differently, an aromatic or heteroaromatic ring system having 5 to 40 ring atoms, which is optionally substituted by one or more radicals $R^1$, where the ring system may also be condensed onto positions 7,8 or 8,9 of the basic compound;

a, b and c are each, independently of one another, 0 or 1; and n is greater than or equal to 1;

where the copolymer contains at least one structural unit which is different from the structural unit of the formula (2), (3) and/or (5), wherein the low-molecular-weight substance is a triplet emitter.

* * * * *